United States Patent
Najafi et al.

(10) Patent No.: US 11,029,203 B2
(45) Date of Patent: *Jun. 8, 2021

(54) GATED SUPERCONDUCTING PHOTON DETECTOR

(71) Applicant: PsiQuantum Corp., Palo Alto, CA (US)

(72) Inventors: Faraz Najafi, Palo Alto, CA (US); Syrus Ziai, Palo Alto, CA (US)

(73) Assignee: PSIQUANTUM CORP., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/544,718

(22) Filed: Aug. 19, 2019

(65) Prior Publication Data
US 2020/0080890 A1    Mar. 12, 2020

Related U.S. Application Data

(63) Continuation of application No. 16/028,293, filed on Jul. 5, 2018, now Pat. No. 10,386,229, which is a
(Continued)

(51) Int. Cl.
*G01J 1/42* (2006.01)
*G01J 1/44* (2006.01)
(Continued)

(52) U.S. Cl.
CPC ............ *G01J 1/44* (2013.01); *G01J 1/0407* (2013.01); *G01J 1/42* (2013.01); *H01L 29/02* (2013.01);
(Continued)

(58) Field of Classification Search
CPC .......... G01J 2001/442; G01J 2005/208; H01L 39/16; H01L 27/18
See application file for complete search history.

(56) References Cited

U.S. PATENT DOCUMENTS 3,059,196 A   10/1962  Lentz
3,119,076 A    1/1964  Schlig et al.
(Continued)

FOREIGN PATENT DOCUMENTS

CN    106289515 A  *  1/2017
CN    106549099       3/2017
(Continued)

OTHER PUBLICATIONS

Akhlaghi at al., "Gated Mode Superconducting Nanowire Single Photon Detectors," Optics Express, vol. 20, No. 2, Jan. 16, 2012, 9 pgs.
(Continued)

*Primary Examiner* — Thanh Luu
(74) *Attorney, Agent, or Firm* — Morgan, Lewis & Bockius LLP

(57) ABSTRACT

An electronic device includes a first superconducting wire (with a first end and a second end) having a first threshold superconducting current. The device includes a second superconducting wire (with a first end and a second end) having a second threshold superconducting current that is less than the first threshold superconducting current. The second end of the first superconducting wire and the second end of the second superconducting wire are coupled to a common voltage node. A resistor is coupled between the first superconducting wire and the second superconducting wire, with a first end of the resistor coupled to the first end of the first superconducting wire and a second end of the resistor coupled to the first end of the second superconducting wire. The device includes a current source coupled with the first superconducting wire, and coupled with a combination of the resistor and the second superconducting wire.

17 Claims, 14 Drawing Sheets

Related U.S. Application Data continuation of application No. PCT/US2018/033041, filed on May 16, 2018.

(60) Provisional application No. 62/572,874, filed on Oct. 16, 2017, provisional application No. 62/520,447, filed on Jun. 15, 2017, provisional application No. 62/507,198, filed on May 16, 2017, provisional application No. 62/507,193, filed on May 16, 2017.

(51) Int. Cl.
    *G01J 1/04* (2006.01)
    *H01L 29/02* (2006.01)
    *H01L 31/08* (2006.01)

(52) U.S. Cl.
    CPC ........ *H01L 31/08* (2013.01); *G01J 2001/442* (2013.01); *G01J 2001/4406* (2013.01); *G01J 2001/4446* (2013.01)

(56) References Cited

U.S. PATENT DOCUMENTS

| | | |
|---|---|---|
| 4,336,561 A | 6/1982 | Murphy |
| 4,365,317 A | 12/1982 | Gheewala |
| 4,509,146 A | 4/1985 | Wang et al. |
| 4,647,954 A | 3/1987 | Graf et al. |
| 5,026,682 A | 6/1991 | Clark et al. |
| 5,030,614 A | 7/1991 | Hollander et al. |
| 5,030,617 A | 7/1991 | Legge |
| 5,041,880 A | 8/1991 | Nojima et al. |
| 5,051,787 A | 9/1991 | Hasegawa |
| 5,173,620 A | 12/1992 | Fujimaki et al. |
| 5,219,826 A | 6/1993 | Kapitulnik |
| 5,247,475 A | 9/1993 | Hasunuma et al. |
| 5,321,004 A | 6/1994 | Perez et al. |
| 5,365,476 A | 11/1994 | Mukhanov |
| 5,376,626 A | 12/1994 | Drehman et al. |
| 5,455,519 A | 10/1995 | Ohori |
| 5,481,119 A | 1/1996 | Higashino et al. |
| 5,521,862 A | 5/1996 | Frazier |
| 5,574,290 A | 11/1996 | You |
| 5,719,105 A | 2/1998 | Odagawa et al. |
| 5,825,240 A | 10/1998 | Geis et al. |
| 5,831,278 A | 11/1998 | Berkowitz |
| 5,892,644 A | 4/1999 | Evans |
| 5,925,892 A | 7/1999 | Mizuno et al. |
| 6,029,075 A | 2/2000 | Das et al. |
| 6,078,517 A | 6/2000 | Herr |
| 6,242,939 B1 | 6/2001 | Nagasawa |
| 6,433,974 B2 | 8/2002 | Heismann |
| 6,774,463 B1 | 8/2004 | Chaudhari et al. |
| 7,227,438 B2 | 6/2007 | Song et al. |
| 7,513,765 B2 | 4/2009 | Liao |
| 7,558,030 B2 | 7/2009 | Lee et al. |
| 7,724,083 B2 | 5/2010 | Herring et al. |
| 7,847,282 B2 | 12/2010 | Sandhu |
| 7,852,106 B2 | 12/2010 | Herr et al. |
| 8,330,145 B2 | 12/2012 | Wakana et al. |
| 8,565,844 B2 | 10/2013 | Smith |
| 8,577,430 B1 | 11/2013 | Smith |
| 8,736,085 B2 | 5/2014 | Sines |
| 9,293,240 B2 | 3/2016 | Flex-Cable |
| 9,443,576 B1 | 9/2016 | Miller |
| 9,500,519 B2 | 11/2016 | Tang et al. |
| 9,509,315 B2 | 11/2016 | McCaughan et al. |
| 9,876,505 B1 | 1/2018 | Dai et al. |
| 9,998,122 B2 | 6/2018 | Hamilton et al. |
| 10,103,736 B1 | 10/2018 | Powell et al. |
| 10,171,086 B2 | 1/2019 | McCaughan et al. |
| 10,177,298 B1 | 1/2019 | Taylor et al. |
| 10,186,858 B2 | 1/2019 | Klaus et al. |
| 10,197,440 B2 | 2/2019 | Najafi |
| 10,262,776 B2 | 4/2019 | Choi et al. |
| 10,361,703 B2 | 7/2019 | Najafi |
| 10,386,229 B2 | 8/2019 | Najafi et al. |
| 10,396,733 B2 | 8/2019 | Najafi et al. |
| 10,454,014 B2 | 10/2019 | Najafi et al. |
| 10,566,516 B2 | 2/2020 | Najafi |
| 10,573,800 B1 | 2/2020 | Najafi |
| 10,586,910 B2 | 3/2020 | Najafi |
| 10,620,044 B2 | 4/2020 | Thompson et al. |
| 10,651,325 B2 | 5/2020 | Najafi et al. |
| 2002/0149453 A1 | 10/2002 | Snitchler et al. |
| 2003/0087503 A1 | 5/2003 | Sakaguchi et al. |
| 2005/0153843 A1 | 7/2005 | Kubota |
| 2005/0197254 A1 | 9/2005 | Stasiak et al. |
| 2006/0073979 A1 | 4/2006 | Thieme et al. |
| 2006/0183327 A1 | 8/2006 | Moon |
| 2006/0270224 A1 | 11/2006 | Song et al. |
| 2008/0026234 A1 | 1/2008 | Sambasivan et al. |
| 2010/0026447 A1 | 2/2010 | Keefe et al. |
| 2010/0171098 A1 | 7/2010 | Suzuki |
| 2011/0108803 A1 | 5/2011 | Deligianni et al. |
| 2011/0254053 A1 | 10/2011 | Goupil et al. |
| 2013/0012392 A1 | 1/2013 | Tanaka et al. |
| 2013/0143744 A1 | 6/2013 | Marsili et al. |
| 2013/0341594 A1 | 12/2013 | Mohseni et al. |
| 2014/0113828 A1 | 4/2014 | Gilbert et al. |
| 2014/0299751 A1 | 10/2014 | Tang et al. |
| 2015/0018218 A1 | 1/2015 | Lakrimi et al. |
| 2015/0179916 A1 | 6/2015 | Pramanik et al. |
| 2015/0348681 A1 | 12/2015 | Huh |
| 2016/0028402 A1 | 1/2016 | McCaughan et al. |
| 2017/0186933 A1 | 6/2017 | Sunter et al. |
| 2018/0033944 A1 | 2/2018 | Ladizinsky et al. |
| 2018/0145664 A1 | 5/2018 | Herr et al. |
| 2018/0364097 A1 | 12/2018 | Najafi |
| 2018/0374979 A1 | 12/2018 | Nozawa |
| 2019/0027672 A1 | 1/2019 | Megrant |
| 2019/0035904 A1 | 1/2019 | Najafi |
| 2019/0035999 A1 | 1/2019 | Najafi |
| 2019/0044051 A1 | 2/2019 | Caudillo et al. |
| 2019/0109595 A1 | 4/2019 | Najafi |
| 2019/0288132 A1 | 9/2019 | Wang et al. |
| 2019/0378874 A1 | 12/2019 | Rosenblatt et al. |
| 2020/0066962 A1 | 2/2020 | Najafi |
| 2020/0080890 A1 | 3/2020 | Najafi et al. |
| 2020/0111944 A1 | 4/2020 | Moodera et al. |
| 2020/0176662 A1 | 6/2020 | Dayton et al. |
| 2020/0194656 A1 | 6/2020 | Najafi |

FOREIGN PATENT DOCUMENTS

| | | |
|---|---|---|
| DE | 2440576 B1 | 1/1976 |
| EP | 0299879 A2 | 1/1989 |
| GB | 2530500 A | 3/2016 |
| JP | S 63299282 A | 12/1988 |
| JP | H 05-55647 A | 3/1993 |
| WO | WO 90/14715 A1 | 11/1990 |
| WO | WO 94/09566 A1 | 4/1994 |
| WO | WO/2012052628 A1 | 4/2012 |

OTHER PUBLICATIONS

Atikian, Haig A. et al., "Superconducting Nanowire Single Photon Detector on Diamond," arXiv:1401.4490v1, physics.optics, Jan. 17, 2014, 5 pgs.

Cheng, Risheng et al., "Photon-Number-Resolving Detector Based on Superconducting Serial Nanowires," IEEE Transports on Applied Superconductivity, vol. 23, No. 1, Feb. 2013, 9 pgs.

Clem, John R. et al., "Geometry-dependent critical currents in superconducting nanocircuits," arXiv:1109.4881v1 [cond-mat.supr-con] Sep. 22, 2011, 29 pgs.

Dai, Daoxin et al., "Mode conversion in tapered submicron silicon ridge optical waveguides," Optics Express, vol. 20, No. 12, Jun. 4, 2012, 15 pgs.

Henrich, D. et al., "Geometry-inducted reduction of the critical current in superconducting nanowires," arXiv:12040616v2 [cond-mat-supr-con] Aug. 22, 2012, 6 pgs.

(56) References Cited

OTHER PUBLICATIONS

Hortensius, H.L. et al., "Critical-Current Reduction in Thin Superconducting Wires Due to Current Crowding," arXiv:12034253v3, [cond-mat-supr-con], May 6, 2012, 5 pgs.

Korzh, B.A. et al., "Demonstrating sub-3 ps temporal resolution in a superconducting nanowire single-photon detector," Apr. 18, 2018, 26 pgs.

Lee, S.-B. et al., "Fabrication of a self-aligned superconducting nanotransistor based NOR logic gate," Microelectronic Engineering 57-58, 2001, 7 pgs., downloaded from https://www.sciencedirect.com/science/article/abs/pii/S0167931701004269).

Marsili, F., "Single-photon detectors based on ultra-narrow superconducting nanowires," Massachusetts Institute of Technology, Department of Electrical Engineering and Computer Science, Dec. 19, 2010, 31 pgs.

Mattioli, Francesco et al., "Photon-number-resolving superconducting nanowire detectors," Superconductor Science and Technology, Aug. 24, 2015, 16 pgs.

McGaughan, "Superconducting thin film nanoelectronics," Sep. 2015, Massachusetts Institute of Technology, submitted to the Department of Electrical Engineering and Computer Science in partial fulfillment of the requirements for the degree of Doctor of Philosopy in Electrical Engineering, 22 pgs.

Murphy et al., "Nanoscale superconducting memory based on the kinetic inductance of asymmetric nanowire loops," Departmwent of Physics, University of Illinois at Urbana Champaign, arXiv:1701.08715v2 [cond-mat.supr-con] Jun. 29, 2017, 19 pgs.

Natarajan et al., "Superconducting nanowire single-photon detectors: physics and applications", 2012, Syperconduc. Sci. Technology vol. 25, p. 063001.

Quaranta et al., Superconductive Three-Terminal Amplifier/Discriminator, IEEE Transactions on Applied Superconductivity, vol. 19, No. 3, Jun. 2, 2009, 4 pgs.

Schmidt, E. et al., AIN-Buffered Superconducting NbN Nanowire Single-Photon Detector on GaAs, IEEE Transactions on Applied Superconductivity, vol. 27, No. 4, Jun. 2017, 5 pgs.

Shiino, Tatsuya et al., "Improvement of Critical Temperature of Superconducting NbTiN and NbN Thin Films Using the AIN Buffer Layer," Superconductor Science and Technology, Mar. 2010, 11 pgs.

Zhao, Qing-Yuan et al., "A compact superconducting nanowire memory element operated by nanowire cryotrons," Massachusetts Institute of Technology, Department of Electrical Engineering and Computer Science, Nov. 22, 2017, 20 pgs.

PsiQuantum Corp., International Search Report and Written Opinion, PCT/US2018/033042, dated Aug. 28, 2018, 13 pgs.

PsiQuanium Corp., International Search Report and Written Opinion, PCT/US2018/033041, dated Jul. 27, 2018, 16 pgs.

PsiQuantum Corp., International Search Report and Written Opinion, PCT/US2018/044091, dated Nov. 7, 2018, 13 pgs.

PsiQuantum Corp., Invitation to Pay Additional Fees/Partial Search Report, PCT/US2018/037892, dated Aug. 20, 2018, 16 pgs.

PsiQuantum Corp., Invitation to Pay Additional Fees/Partial Search Report, PCT/US2018/037892, dated Aug. 20, 2018, 12 pgs.

PsiQuantum Corp., Invitation to Pay Additional Fees/Partial Search Report, PCT/US2018/054414, dated Jan. 24, 2019, 21 pgs.

PsiQuantum Corp., International Search Report and Written Opinion, PCT/US2018/054414, dated Mar. 20, 2019, 21 pgs.

Najafi, Office Action dated Dec. 12, 2018, U.S. Appl. No. 16/028,288, 6 pgs.

Najafi, Notice of Allowance dated Apr. 5, 2019, U.S. Appl. No. 16/028,288, 10 pgs.

Najafi, Office Action dated Sep. 21, 2018, U.S. Appl. No. 16/028,293, 8 pgs.

Najafi, Final Office Action dated Mar. 1, 2019 U.S. Appl. No. 16/028,293, 5 pgs.

Najafi, Notice of Allowance dated Sep. 21, 2018, U.S. Appl. No. 16/012,520, 9 pgs.

Najafi, Office Action, U.S. Appl. No. 16/136,124, dated Apr. 4, 2019, 9 pgs.

Najafi, Quayle Office Action, U.S. Appl. No. 16/151,180, dated Jan. 31, 2019, 5pgs.

Najafi, Notice of Allowace, U.S. Appl. No. 16/151,180, dated Mar. 14, 2019, 5 pgs.

Najafi, Notice of Allowance U.S. Appl. No. 16/151,190, dated Feb. 6, 2019, 11 pgs.

Najafi, Notice of Allowance U.S. Appl. No. 16/151,190, dated Mar. 28, 2019, 5 pgs.

Najafi, Office Action, U.S. Appl. No. 16/046,815, dated Feb. 4, 2019, 9 pgs.

Najafi, Office Action, U.S. Appl. No. 16/046,807, dated Mar. 18, 2019, 10 pgs.

Najafi, Office Action, U.S. Appl. No. 16/107,143, dated Mar. 19, 2019, 11 pgs.

PsiQuantum Corp., International Search Report and Written Opinion, PCT/US2019/017687, dated Apr. 30, 2019, 8 pgs.

Stanfield, CMOS-Compatible, Piezo-Optomechanically Tunable Photonics for Visable Wavelengths and Cryogenic, Temperatures, vol. 27, Issue 20, pp. 28588-28605, 2019.

PsiQuantum Corp., International Search Report, PCT/US2019/017691, dated Apr. 23, 2019, 7 pgs.

PsiQuantum Corp., International Search Report and Written Opinion, PCT/US2019/030019, dated Jul. 17, 2019, 8 pgs.

Mohsen K. Akhlaghi et al., "Gated Mode Superconducting Nanowire Single Photon Detectors", Optics Express, vol. 20, No. 2, Jan. 16, 2012, 1608-1612, XP055492983, US ISSN: 1094-1087, DOI: 10.1364/OE.20.001608.

PsiQuantum Corp., PCT/US2018/044091, International Preliminary Report on Patentability, Jan. 28, 2020, 6 pgs.

Najafi, Non-Final Office Action, U.S. Appl. No. 16/664,716, dated Apr. 1, 2020, 14 pgs.

PsiQuantum, International Search Report / Written, PCT/US2019/051853, dated Jan. 27, 2020, 13 pgs.

Mohsen K. Akhlaghi et al., Gated Mode Superconducting Nanowire Single Photon Detectors, vol. 20, No. 2, Jan. 16, 2012, ISSN 1094-4087, 9 pgs.

PsiQuantum, International Preliminary Report on Patentability, PCT/US12018/033041, dated Nov. 26, 2019, 8 pgs.

PsiQuantum, International Preliminary Report on Patentability, PCT/US2018/054414 , dated Apr. 8, 2020, 15 pgs.

PsiQuantum, International Search Report / Written, PCT/US2018/037892, dated Oct. 17, 2018, 18 pgs.

PsiQuantum, International Preliminary Report on Patentability, PCT/US2018/037892, dated Dec. 17, 2019, 12 pgs.

Najafi, Non-Final Office Action, U.S. Appl. No. 16/553,068, dated Apr. 1, 2020, 11 pgs.

Najafi, Notice of Allowance, U.S. Appl. No. 16/543,256, dated Dec. 9, 2020, 12 pgs.

Chung, Non-Final Office Action, U.S. Appl. No. 16/849,829, dated Aug. 21, 2020, 5 pgs.

Chung, Notice of Allowance, U.S. Appl. No. 16/849,829, dated Dec. 8, 2020, 5 pgs.

Psiquantum Corp., International Search Report / Written Opinion, PCT/US20/28519, dated Jan. 12, 2021, 9 pgs.

Najafi, Non-Final Office Action, U.S. Appl. No. 16/656,506, dated Aug. 13, 2020, 18 pgs.

Najafi, Notice of Allowance, U.S. Appl. No. 16/553,068, dated Sep. 18, 2020, 8 pgs.

Najafi, Notice of Allowance, U.S. Appl. No. 16/473,550, dated Sep. 24, 2020, 8 pgs.

Najafi, Notice of Allowance, U.S. Appl. No. 16/473,550, dated Nov. 3, 2020, 2 pgs.

Najafi, Notice of Allowance, U.S. Appl. No. 16/553,068, dated Nov. 12, 2020, 2 pgs.

Najafi, Notice of Allowance, U.S. Appl. No. 16/656,506, dated Nov. 3, 2020, 12 pgs.

Najafi, Final Office Action, U.S. Appl. No. 16/664,716, dated Oct. 17, 2020, 14 pgs.

Najafi, Notice of Allowance, U.S. Appl. No. 16/473,547, dated Dec. 9, 2020, 8 pgs.

PSIQUANTUM Corp., Notice of Allowance, U.S. Appl. No. 16/849,829, dated Mar. 1, 2021, 8 pgs.

(56) References Cited

OTHER PUBLICATIONS

PSIQUANTUM Corp., Notice of Allowance, U.S. Appl. No. 16/664,716, dated Jan. 28, 2021, 8 pgs.
PSIQUANTUM Corp., Notice of Allowance, U.S. Appl. No. 16/473,547, dated Jan. 27, 2021, 2 pgs.
PSIQUANTUM Corp., Notice of Allowance, U.S. Appl. No. 16/543,256, dated Feb. 4, 2021, 2 pgs.
PSIQUANTUM Corp., Notice of Allowance, U.S. Appl. No. 16/849,829, dated Apr. 5, 2021, 2 pgs.

* cited by examiner

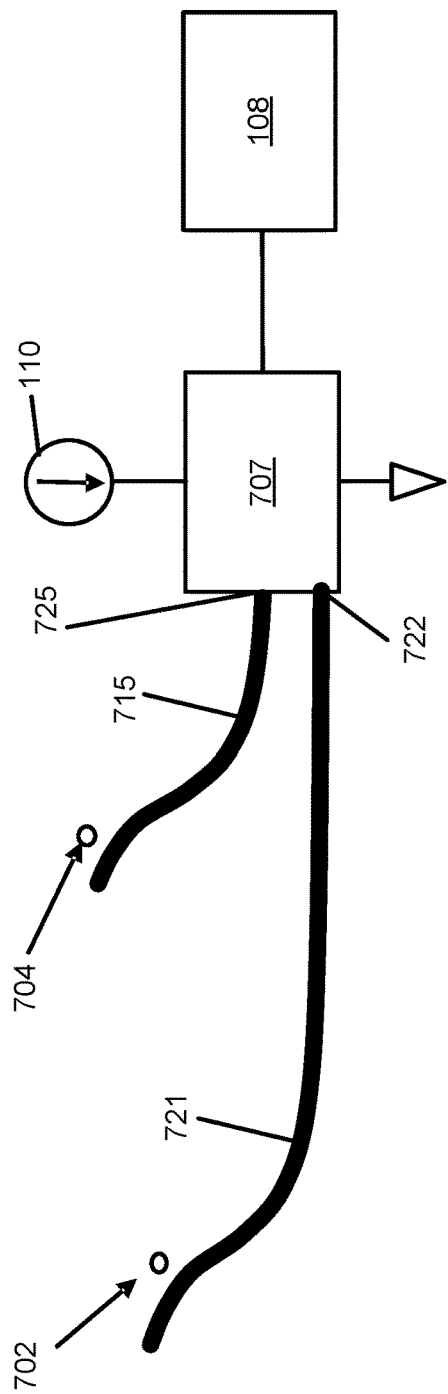
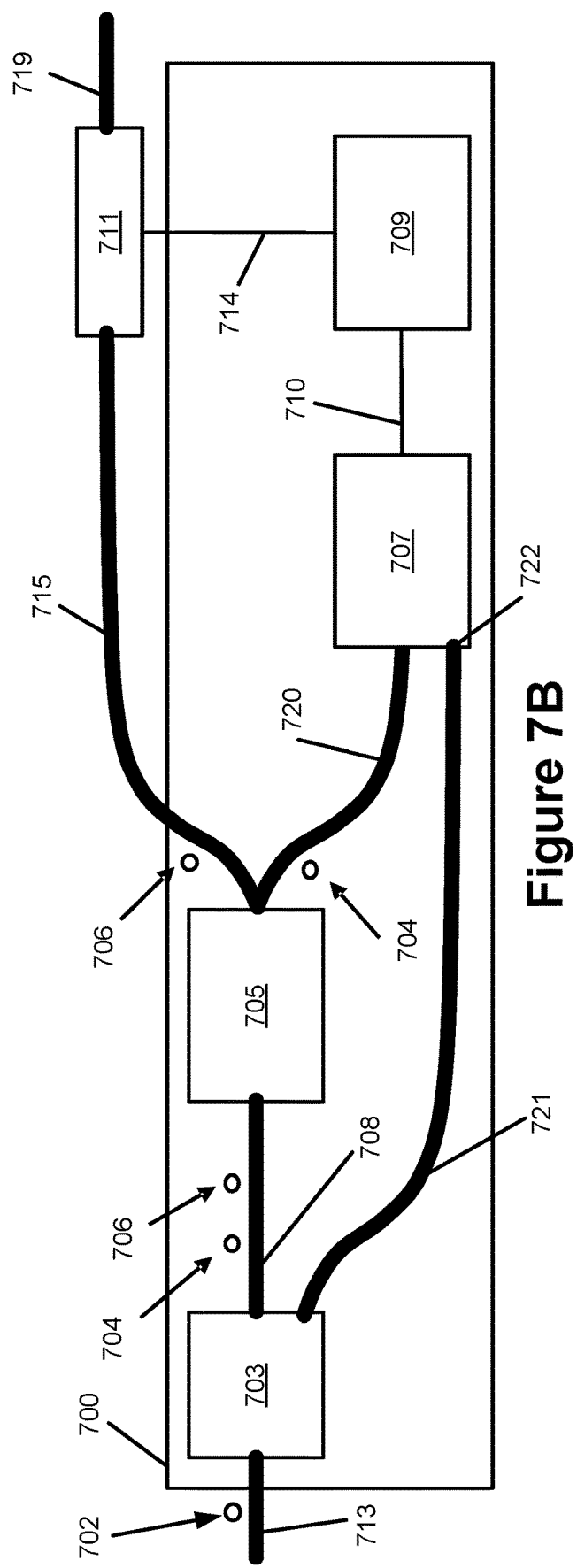
Figure 7A
Figure 7B

GATED SUPERCONDUCTING PHOTON DETECTOR

PRIORITY AND RELATED APPLICATIONS

This application is a continuation of U.S. patent application Ser. No. 16/028,293, filed Jul. 5, 2018, which is a continuation of PCT International Application No. PCT/US2018/033041, filed May 16, 2018, which claims priority to U.S. Provisional Application No. 62/507,198, filed May 16, 2017, entitled "Pump-Gated Superconducting Photon Detector;" U.S. Provisional Application No. 62/520,447, filed Jun. 15, 2017, entitled "Niobium-Germanium Superconducting Photon Detector," U.S. Provisional Application No. 62/507,193, filed May 16, 2017, entitled "Cascaded Superconducting Signal Amplifier;" and U.S. Provisional Application No. 62/572,874, filed Oct. 16, 2017, each of which is incorporated by reference herein in its entirety.

TECHNICAL FIELD

This relates generally to photon detectors, including but not limited to, superconducting photon detectors.

BACKGROUND

Photon detectors are essential components in many electronic devices. Ultra-sensitive photon detectors that are capable of detecting a small number of photons, such as individual photons (e.g., single photons), are used in a variety of applications, such as optical communications, medical diagnostics, and space research. One such use of ultra-sensitive photon detectors is for optical quantum information applications.

Superconductors are materials capable of operating in a superconducting state with zero electrical resistance under particular conditions.

SUMMARY

There is a need for systems and/or devices with more efficient and effective methods for detecting photons. Such systems, devices, and methods optionally complement or replace conventional systems, devices, and methods for detecting photons.

Many photon detectors suffer from false detections and inaccuracies due to heat and environmental effects. For example, although superconducting nanowires are capable of detecting single photons, the superconducting nanowires are subject to noise signals, and often provide incorrect measurements (e.g., false positives).

Operating the detectors only during a time period when a particular photon or set of photons is anticipated (e.g., when a photon from a particular photon source is anticipated) can reduce the erroneous measurements. In some instances, photon detectors need to be time-gated using external electronics so as to only count photons during a specific time frame. As described herein, when a superconducting wire is used as the time-gate for the detector, the time-gate can be triggered using a photon pump (e.g., a photon pump serving as a source of photons for generating photons to be detected in a process, such as a spontaneous parametric down-conversion). Using a photon pump as a trigger allows faster response times and better correlation between the trigger and the arrival of the photons to be detected compared to conventional electronics.

Additionally, many superconductors require very low temperatures to operate in a superconducting state. However, operating superconducting circuitry at these low temperatures can be challenging. Achieving temperatures near absolute zero (e.g., via the use of lasers and/or magnetic fields), such as less than 1 Kelvin, 1-2 Kelvin, or 2-3 Kelvin, often requires high performance cooling systems that are large and costly. In particular, the challenges become significant as the desired temperature approaches zero. In addition, it is difficult to maintain the near-zero temperature due to high cooling power needed for reliable operation of many superconducting circuits. Therefore, there is a great need for superconducting circuitry that is capable of operating in a superconducting state at higher temperatures (e.g., 3-4 Kelvin, 4-5 Kelvin, 5-10 Kelvin, etc.). The present disclosure describes various embodiments of such superconducting circuitry.

In one aspect, some embodiments include a photon detector system having: (1) a first circuit that includes: (a) a first superconducting wire having a first threshold superconducting current; (b) a second superconducting wire having a second threshold superconducting current that is less than the first threshold superconducting current; and (c) a resistor with a first end of the resistor coupled to a first end of the first superconducting wire and a second end of the resistor, opposite to the first end of the resistor, coupled to a first end of the second superconducting wire; (2) one or more current sources coupled to the first end of the first superconducting wire, the one or more current sources configured to supply a first current (e.g., bias current) that is below the second threshold superconducting current; and (3) a second circuit coupled to the first end of the second superconducting wire. In response to receiving light of first intensity (e.g., a portion of pump light) at the first superconducting wire, the first superconducting wire transitions from a superconducting state to a non-superconducting state, thereby redirecting at least a first portion of the first current through the resistor. In response to receiving light of second intensity (e.g., single photons) that is less than the first intensity at the second superconducting wire while the first superconducting wire is in the non-superconducting state, the second superconducting wire transitions from a superconducting state to a non-superconducting state, thereby redirecting at least a second portion of the first current to the second circuit. Depending on the energy (i.e., frequency) of the photons involved, in other embodiments the second intensity can be equal to or greater than the first intensity.

In another aspect, some embodiments include a method for detecting light, including: (1) providing a first current to a first circuit that includes: (a) a first superconducting wire having a first threshold superconducting current; (b) a second superconducting wire having a second threshold superconducting current that is less than the first threshold superconducting current; and (c) a resistor with a first end of the resistor coupled to a first end of the first superconducting wire and a second end of the resistor, opposite to the first end of the resistor, coupled to a first end of the second superconducting wire; (2) receiving light of first intensity at the first superconducting wire; and (3) receiving light of second intensity to the second superconducting wire. The light of second intensity causes the second superconducting wire to transition from the superconducting state to a non-superconducting state and causes redirection of the first current toward a second circuit that is coupled to the first end of the second superconducting wire. The light of first intensity causes the first superconducting wire to transition from the superconducting state to a non-superconducting state and causes redirection of the first current toward the second superconducting wire while the second superconducting wire operates in a superconducting state. The first current is less than the second threshold superconducting current, and there for redirecting the first current toward the second superconducting wire does not cause the second superconducting wire to transition to a non-superconducting state.

In yet another aspect, some embodiments include an electronic device having: (1) a first superconducting wire having a first threshold superconducting current; (2) a second superconducting wire having a second threshold superconducting current that is less than the first threshold superconducting current; and (3) a resistor with a first end of the resistor coupled to a first end of the first superconducting wire and a second end of the resistor, opposite to the first end of the resistor, coupled to a first end of the second superconducting wire.

In yet another aspect, some embodiments include a method for fabricating a superconducting photodetector circuit. The method including: (1) depositing a thin film of a superconducting material over a substrate; and (2) removing one or more portions of the thin film to define: (a) a first superconducting wire having a first threshold superconducting current; and (b) a second superconducting wire having a second threshold superconducting current that is less than the first threshold superconducting current.

Thus, devices and systems are provided with methods for fabricating and operating superconducting photodetector circuitry, thereby increasing the effectiveness, efficiency, and user satisfaction with such systems and devices.

BRIEF DESCRIPTION OF THE DRAWINGS

For a better understanding of the various described embodiments, reference should be made to the Detailed Description below, in conjunction with the following drawings in which like reference numerals refer to corresponding parts throughout the figures.

FIGS. 7A-7C illustrate a photonic circuit employing a gated superconducting photon detector in accordance with one or more embodiments.

DETAILED DESCRIPTION

Figure 1A:
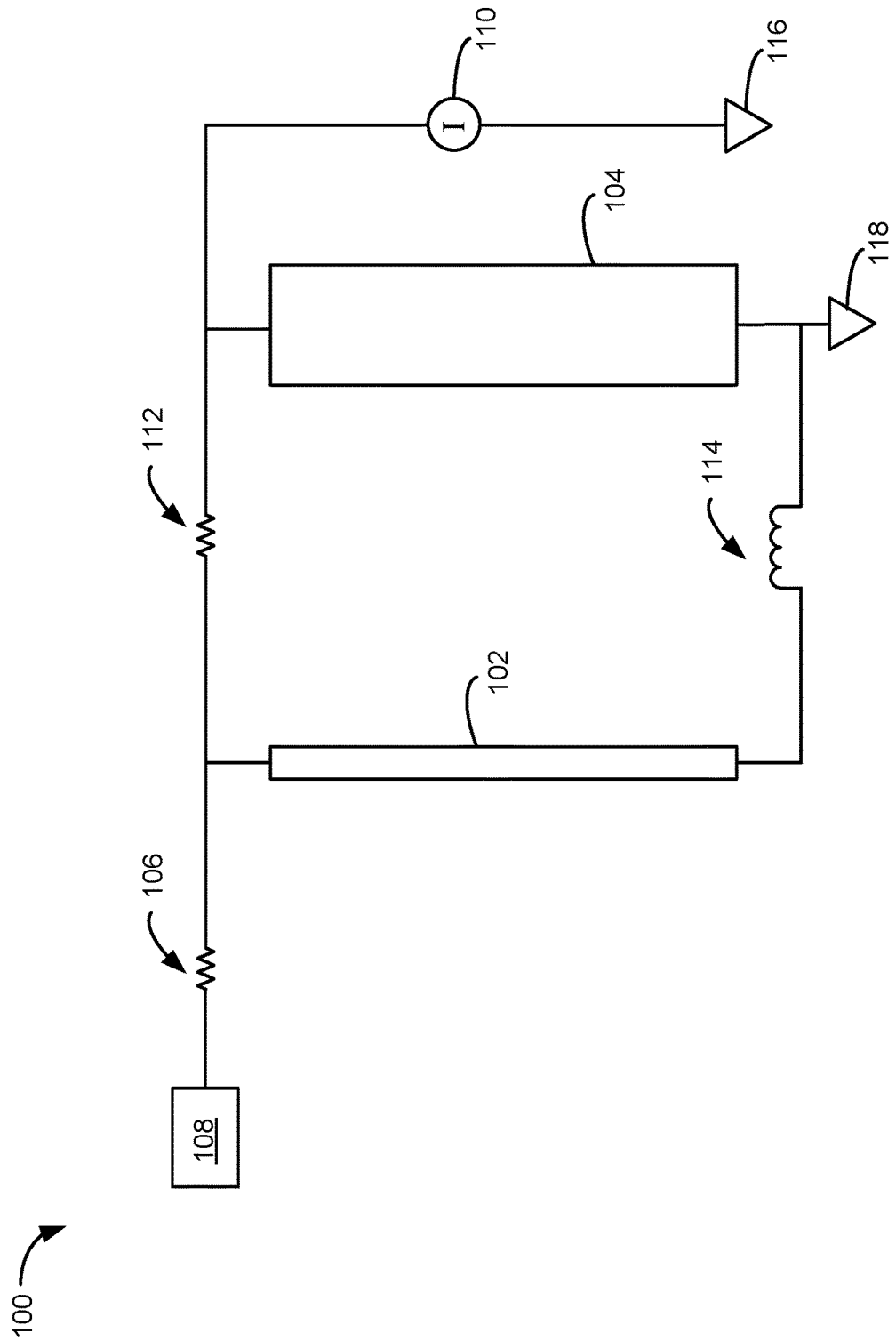
FIGS. 1A-1B are block diagrams illustrating representative superconducting photodetector circuits in accordance with some embodiments.

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Many modifications and variations of this disclosure can be made without departing from its spirit and scope, as will be apparent to those skilled in the art. The specific embodiments described herein are offered by way of example only, and the disclosure is to be limited only by the terms of the appended claims, along with the full scope of equivalents to which such claims are entitled.

As used herein, a "superconducting circuit" or "superconductor circuit" is a circuit having one or more superconducting materials. For example, a superconducting photodetector circuit is a photodetector circuit that includes one or more superconducting materials. As used herein, a "superconducting" material is a material that is capable of operating in a superconducting state (under particular conditions). For example, a material that operates as a superconductor (e.g., operates with zero electrical resistance) when cooled below a particular temperature (e.g., a critical temperature) and having less than a threshold current flowing through it. A superconducting material is also called herein a superconduction-capable material. The superconducting materials may also operate in an "off" state where little or no current is present. In some embodiments, the superconducting materials operate in a non-superconducting state during which the materials have a non-zero electrical resistance (e.g., a resistance in the range of one thousand to ten thousand ohms). For example, a superconducting material supplied with a current greater than a threshold superconducting current for the superconducting material may transition from a superconducting state with zero electrical resistance to a non-superconducting state with non-zero electrical resistance. As an example, superconducting wire 104 is a superconducting material that is capable of operating in a superconducting state (e.g., under particular operating conditions).

As used herein, a "wire" is a section of material configured for transferring electrical current. In some embodiments, a wire includes a section of material conditionally capable of transferring electrical current (e.g., a wire made of a superconducting material that is capable of transferring electrical current while the wire is maintained at a temperature below a critical temperature). A cross-section of a wire (e.g., a cross-section that is perpendicular to a length of the wire) optionally has a geometric (e.g., flat or round) shape or an irregular (also sometimes called a non-geometric) shape. In some embodiments, a length of a wire is greater than a width or a thickness of the wire (e.g., the length of a wire is at least 5, 6, 7, 8, 9, or 10 times greater than the width and the thickness of the wire).

As used herein, the term "light intensity" or simply "intensity" refers to the number of photons incident on a unit area, e.g., a superconducting wire, per unit time. The term "intensity" includes a situation where only a single photon is incident on the detector in a given time period and also includes a situation where multiple photons are incident on the detector in the given time period. For example, a first light pulse having a first intensity that is greater than a second light pulse having a second intensity includes a first light pulse that includes more photons than a second light pulse. For example, the first light pulse can include 10 photons or 100 photons, while the second light pulse can include one photon, two photons, . . . , 9 photons, etc.

Figure 1B:
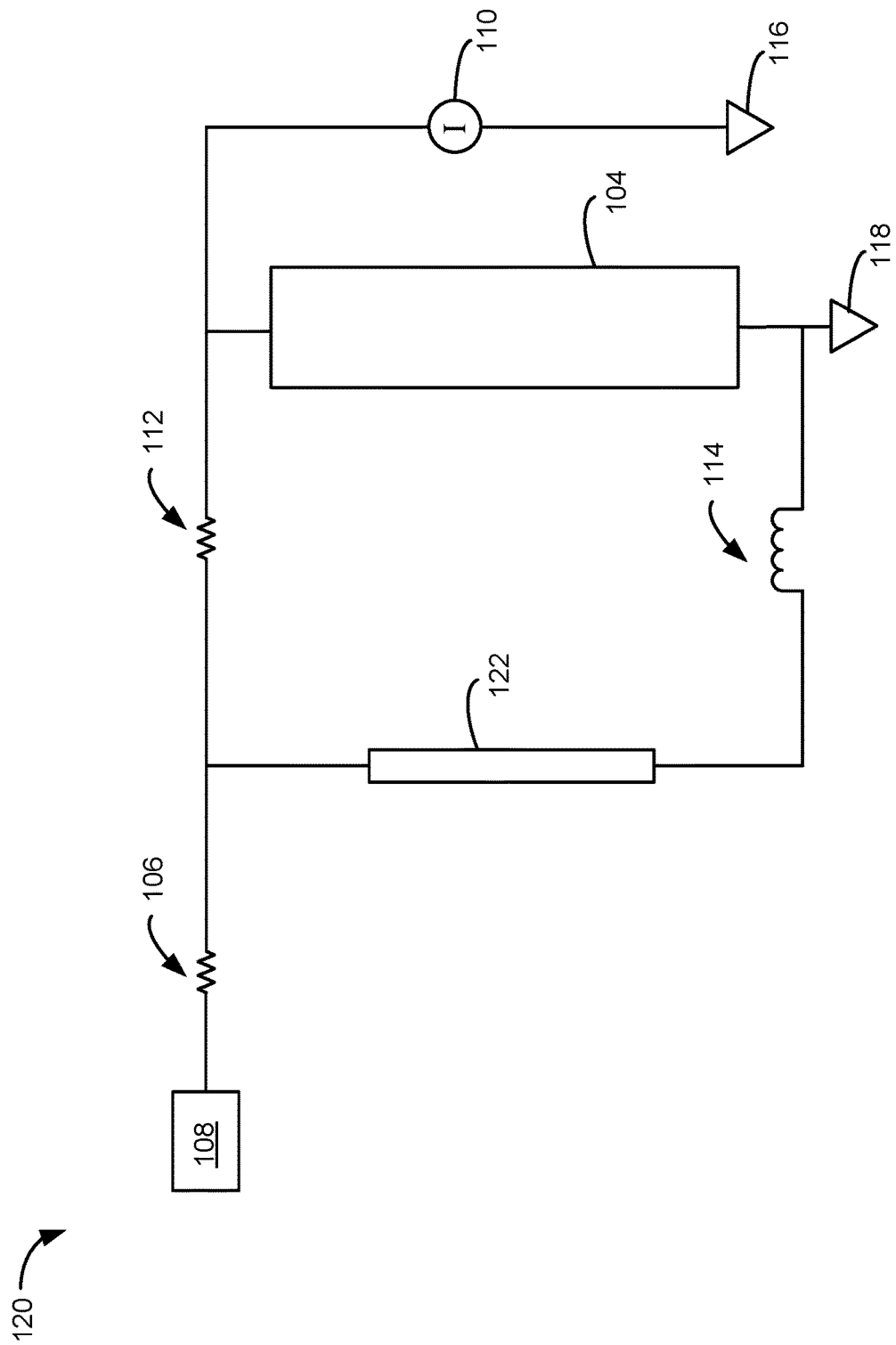

FIGS. 1A-1B are block diagrams illustrating representative superconducting photodetector circuits in accordance with some embodiments. FIG. 1A shows a superconducting photodetector circuit 100 having a current source 110, a first superconducting wire 104 and a second superconducting wire 102, resistor(s) 112, and an optional inductor 114. In some embodiments, the circuit 100 is electrically connected to electrical grounds 116 and 118. FIG. 1A also shows a second circuit 108 (e.g., a readout circuit) connected to the second superconducting wire 102 (optionally via resistor(s) 106). In some embodiments, the ground 116 is electrically connected with the ground 118. In some embodiments, the current source 110 is configured to supply a current that is below a threshold superconducting current for the second superconducting wire 102 (e.g., 70%, 80%, or 90% of the threshold superconducting current for the second superconducting wire 102). In some embodiments, the inductor 114 is configured to delay a transition of the first superconducting wire 104 (e.g., by 100 ps, 500 ps, or 2 ns) from a non-superconducting state to a superconducting state.

In some embodiments, the resistor 112 has a resistance that is less than a resistance of the first superconducting wire 104 when the first superconducting wire 104 is in a non-superconducting state. In some embodiments, the resistor 112 has a resistance that is less than a resistance of the second superconducting wire 102 when the second superconducting wire 102 is in a non-superconducting state. In some embodiments, the resistor 112 has a resistance that is less than a resistance of the first superconducting wire 104 when the first superconducting wire 104 is in a non-superconducting state and a resistance of the second superconducting wire 102 when the second superconducting wire 102 is in a non-superconducting state. In some embodiments, the resistor 106 has a resistance that is less than a resistance of the first superconducting wire 104 when the first superconducting wire 104 is in a non-superconducting state. In some embodiments, the resistor 106 has a resistance that is less than a resistance of the second superconducting wire 102 when the second superconducting wire 102 is in a non-superconducting state. In some embodiments, the resistor 106 has a resistance that is less than a resistance of the first superconducting wire 104 when the first superconducting wire 104 is in a non-superconducting state and a resistance of the second superconducting wire 102 when the second superconducting wire 102 is in a non-superconducting state. In some embodiments, the resistor 112 and/or the resistor 106 includes one or more distinct components. In some embodiments, the resistor 106 includes one or more resistances inherent in the circuitry 108 and/or the connection between circuitry 108 and the second superconducting wire 102.

In some embodiments, the first wire 104 and the second wire 102 have a same thickness (e.g., 10 nm). In some embodiments, the first wire 104 and the second wire 102 have different thicknesses. In some embodiments, the first wire 104 and the second wire 102 are composed of a same material (e.g., niobium or niobium alloy). In some embodiments, the first wire 104 and the second wire 102 are composed of different materials. In some embodiments (not shown), the first wire 104 and the second wire 102 have a same width (e.g., 100 nm). In some embodiments (not shown), the first wire 104 and the second wire 102 have different widths.

FIG. 1B shows a superconducting photodetector circuit 120 that is similar to the superconducting photodetector circuit 100 in FIG. 1A, except that the second superconducting wire 122 in FIG. 1B has a shorter length than the first superconducting wire 104. In various embodiments, the thickness, width, and length of the first wire 104 and the second wire 122 are varied (e.g., independently varied) to achieve desired superconducting current thresholds for each wire.

Figure 2A:
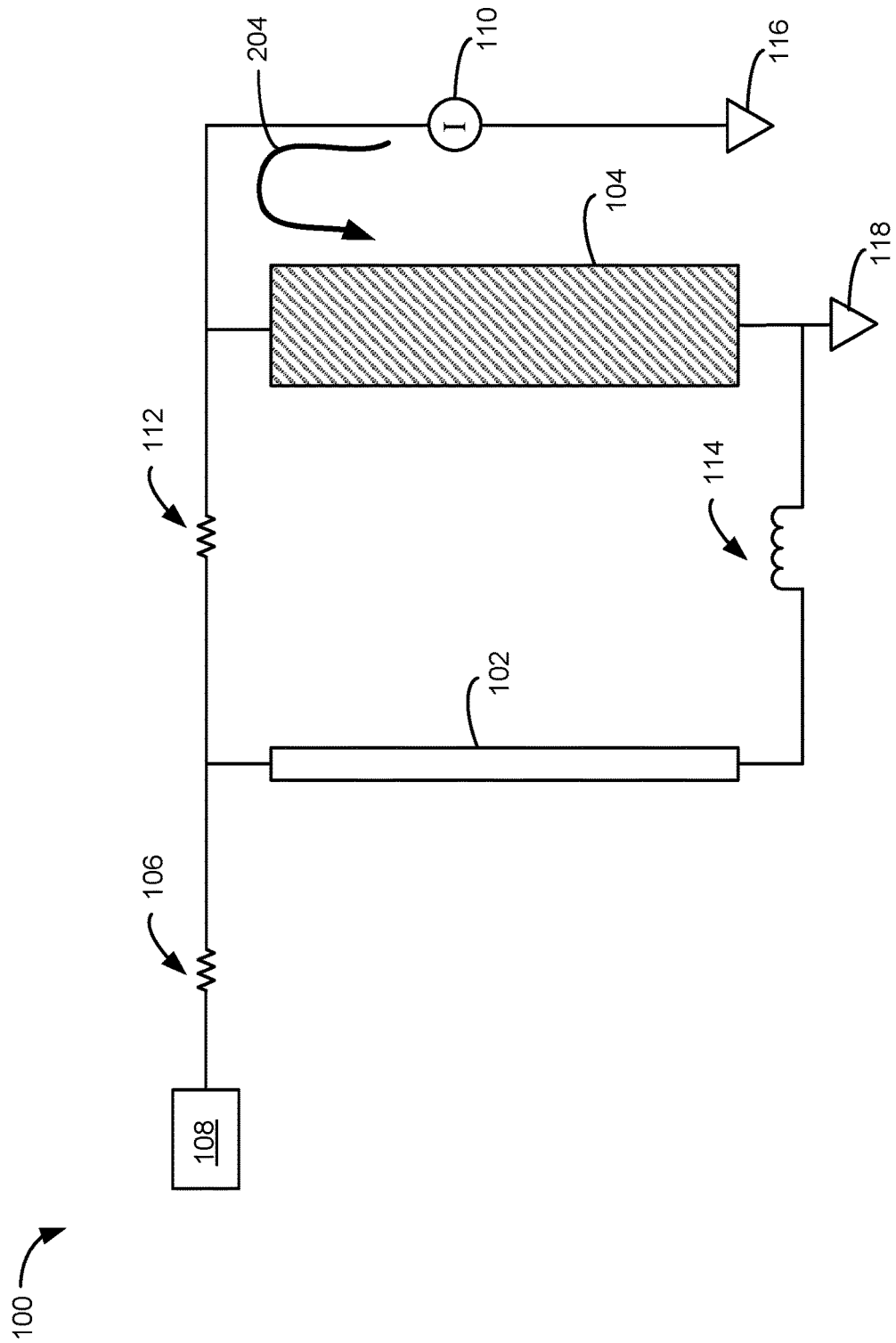
FIGS. 2A-2F are diagrams illustrating a representative operating sequence of the superconducting photodetector circuit of FIG. 1A in accordance with some embodiments.

FIGS. 2A-2F are prophetic diagrams illustrating a representative operating sequence of the superconducting photodetector circuit 100 of FIG. 1A in accordance with some embodiments. FIG. 2A shows the superconducting photodetector circuit 100 at a first time. As shown in FIG. 2A, at the first time the current source 110 supplies a current 204, which flows through the first superconducting wire 104. FIG. 2A also shows the second superconducting wire 102 in an off state (e.g., since no current is supplied to the second wire 102 at the first time). In some embodiments and instances, all of the current 204, or substantially all of the current 204 (e.g., 95%, 98%, or 99%), flows through the first superconducting wire 104 due to the wire 104 being in a superconducting state and having zero electrical resistance (e.g., a resistance lower than the resistance of resistor 112). In some embodiments and instances, the current 204 is below a superconducting current threshold for the first superconducting wire 104, and thus the first superconducting wire 104 operates in a superconducting state (denoted by the hash marks on the wire 104 in FIG. 2A) at the first time.

Figure 2B:
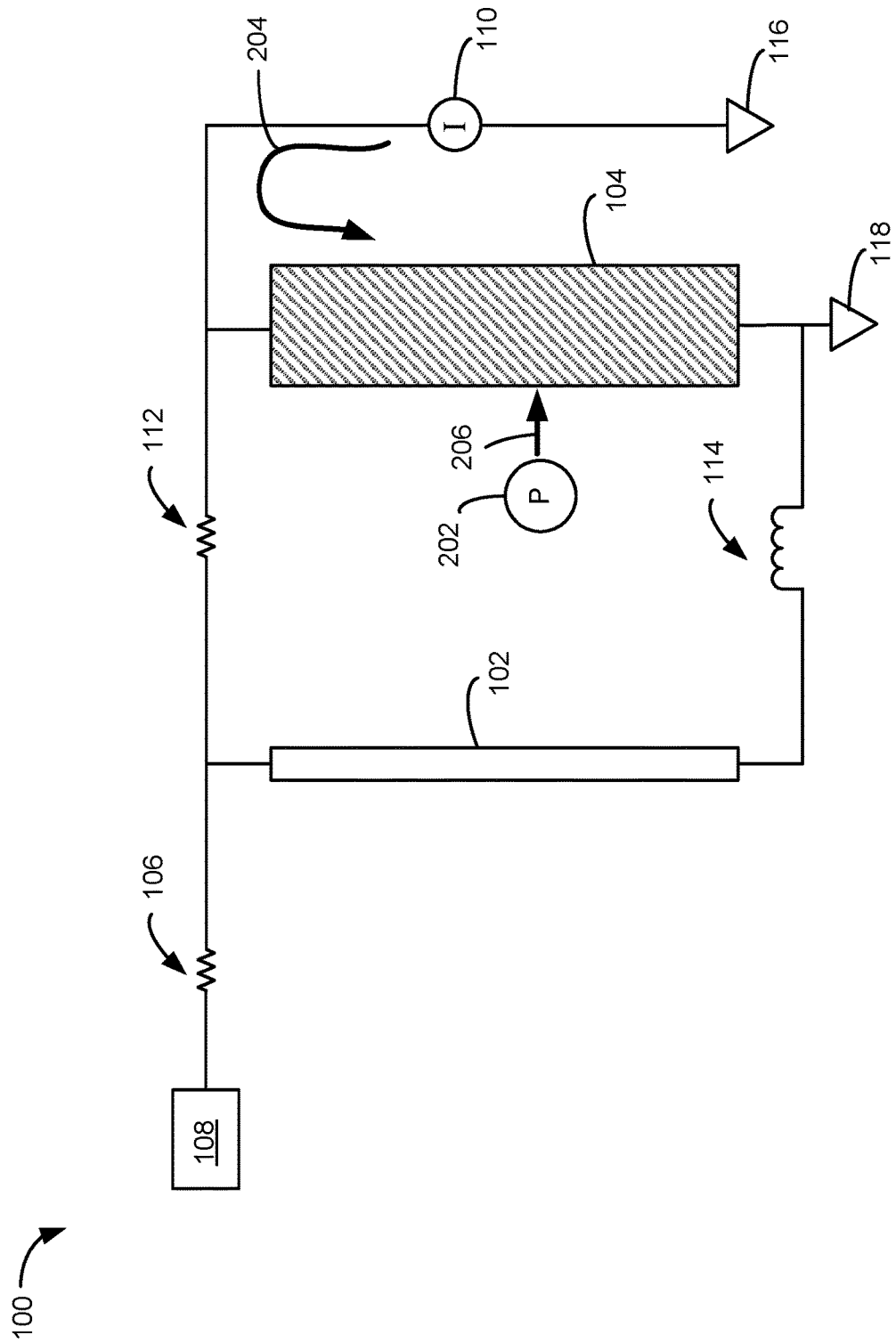

FIG. 2B shows the superconducting photodetector circuit 100 at a second time. As shown in FIG. 2B, at the second time a photon source 202 (sometimes also called a photon pump) supplies the first superconducting wire 104 with one or more photons 206 (e.g., in some configurations, or in some circumstances, a pulse including at least 100 photons). In some instances, when the photons 206 are incident on the wire 104, the photons break Cooper pairs and thereby reduce the maximum superconducting current density in the wire 104 and also can create a hotspot in the wire. In some embodiments, the photon source 202 is configured to supply sufficient energy to the wire 104 (e.g., by way of multiple photons or a single relatively high energy photon) so as to trigger a transition of the first wire 104 from the superconducting state to a non-superconducting state. In some embodiments, due to physical separation of wires 102 and 104, and placement of photon source 202 proximate first wire 104, photons 206 are not received by wire 102.

In some embodiments (not shown), the photon source 202 is replaced by a current source that supplies a current to the first superconducting wire 104. In some embodiments, the current source is configured to supply a current that, when combined with the current 204 from the current source 110, exceeds the superconducting current threshold for the first wire 104.

Figure 2C:
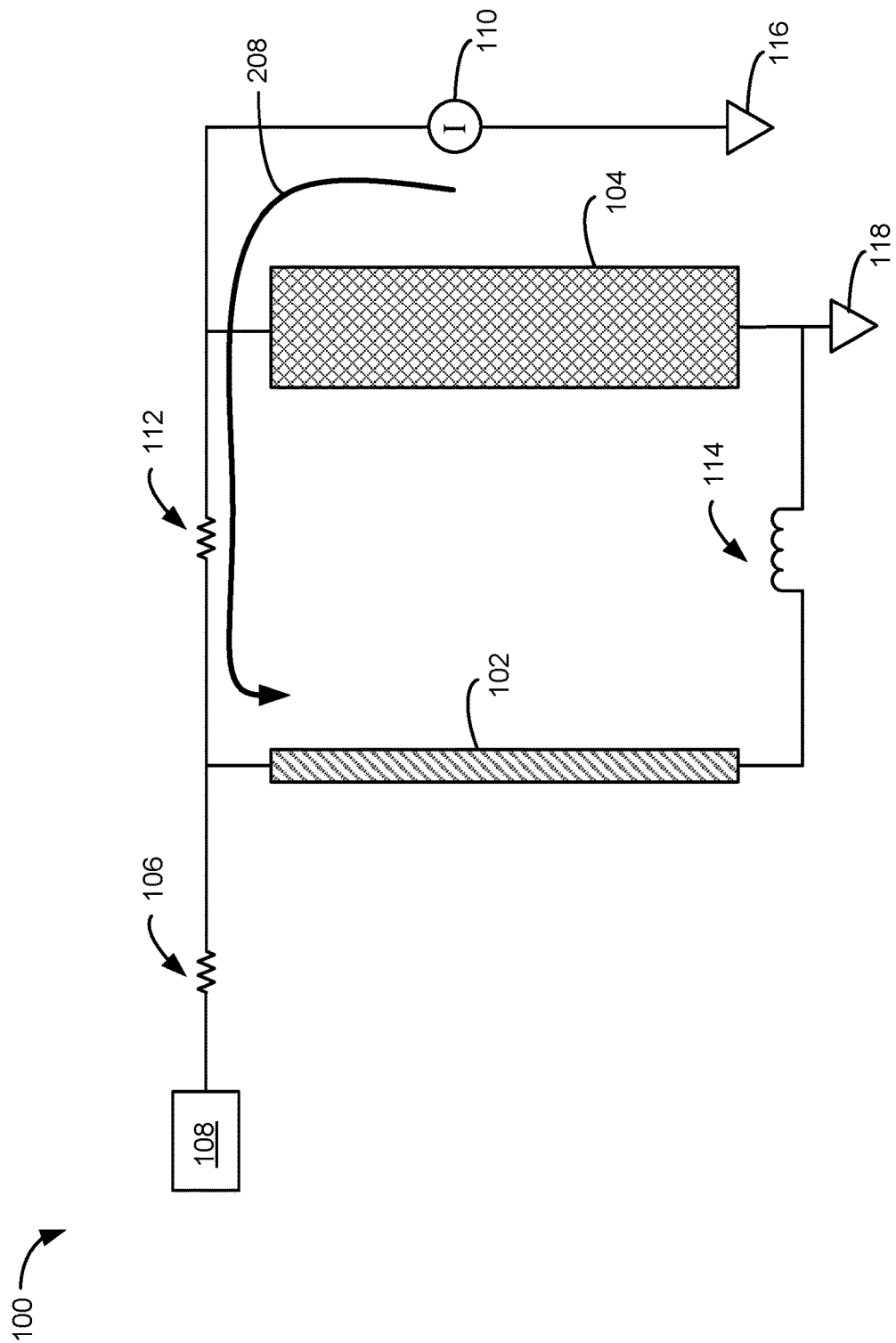

FIG. 2C shows the superconducting photodetector circuit 100 at a third time. As shown in FIG. 2C, at the third time the first superconducting wire 104 transitions to the non-superconducting state (denoted by the crosshatching of the wire 104 in FIG. 2C) in response to the current 204 supplied by the current source 110 and the photons 206 from the photon source 202. The first superconducting wire 104 has a non-zero resistance while in the non-superconducting state, therefore current 208 supplied by the current source 110 is redirected through the resistor 112 and the second superconducting wire 102. In some embodiments and instances, all of the current from the current source 110, or substantially all of the current (e.g., 95%, 98%, or 99%), flows through the resistor 112 and the second superconducting wire 102. This flow of current is due to the resistor 112 and the second wire 102 having a lower resistance than the first wire 104 and the resistor 106. In some embodiments and instances, the current 208 is below a superconducting current threshold for the second superconducting wire 102, and thus the second superconducting wire 102 operates in a superconducting state (denoted by the hash marks on the wire 102 in FIG. 2C) at the third time.

Figure 2D:
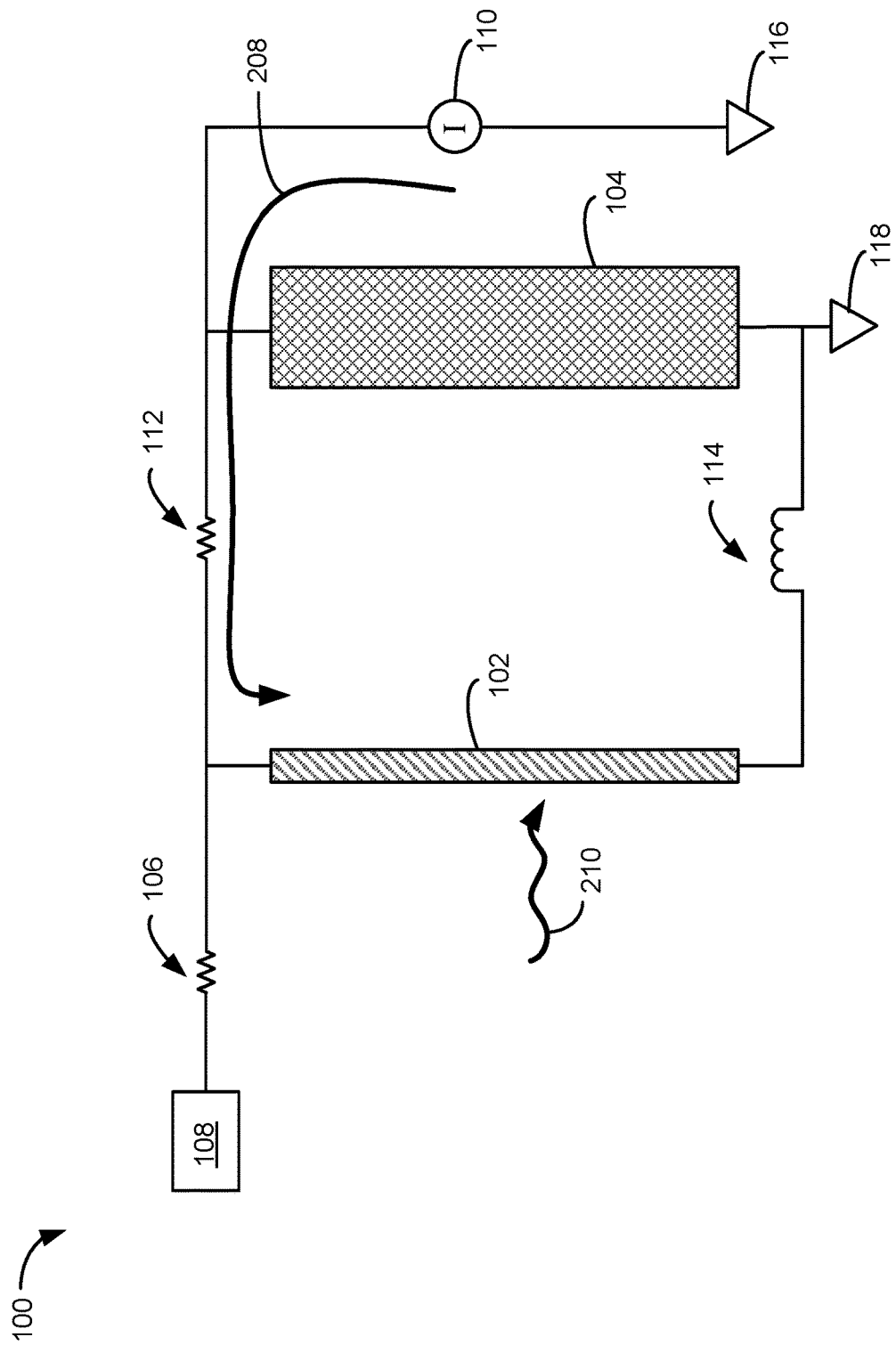

FIG. 2D shows the superconducting photodetector circuit 100 at a fourth time. As shown in FIG. 2D, at the fourth time one or more photons 210 are incident on the second superconducting wire 210. In some instances, when the photon(s) 210 incident the wire 102, they lower the superconducting current threshold for the wire 102 (or a portion thereof). In some embodiments, the current source 110 is configured to supply sufficient current such that a transition of the second wire 102 from the superconducting state to a non-superconducting state is triggered when the photon(s) 210 incident the wire. In some instances, when the photons 210 are incident on the wire 102, the photons break Cooper pairs and thereby lower the superconducting current threshold for the wire 102, and/or reduce the maximum superconducting current density in the wire 102.

Figure 2E:
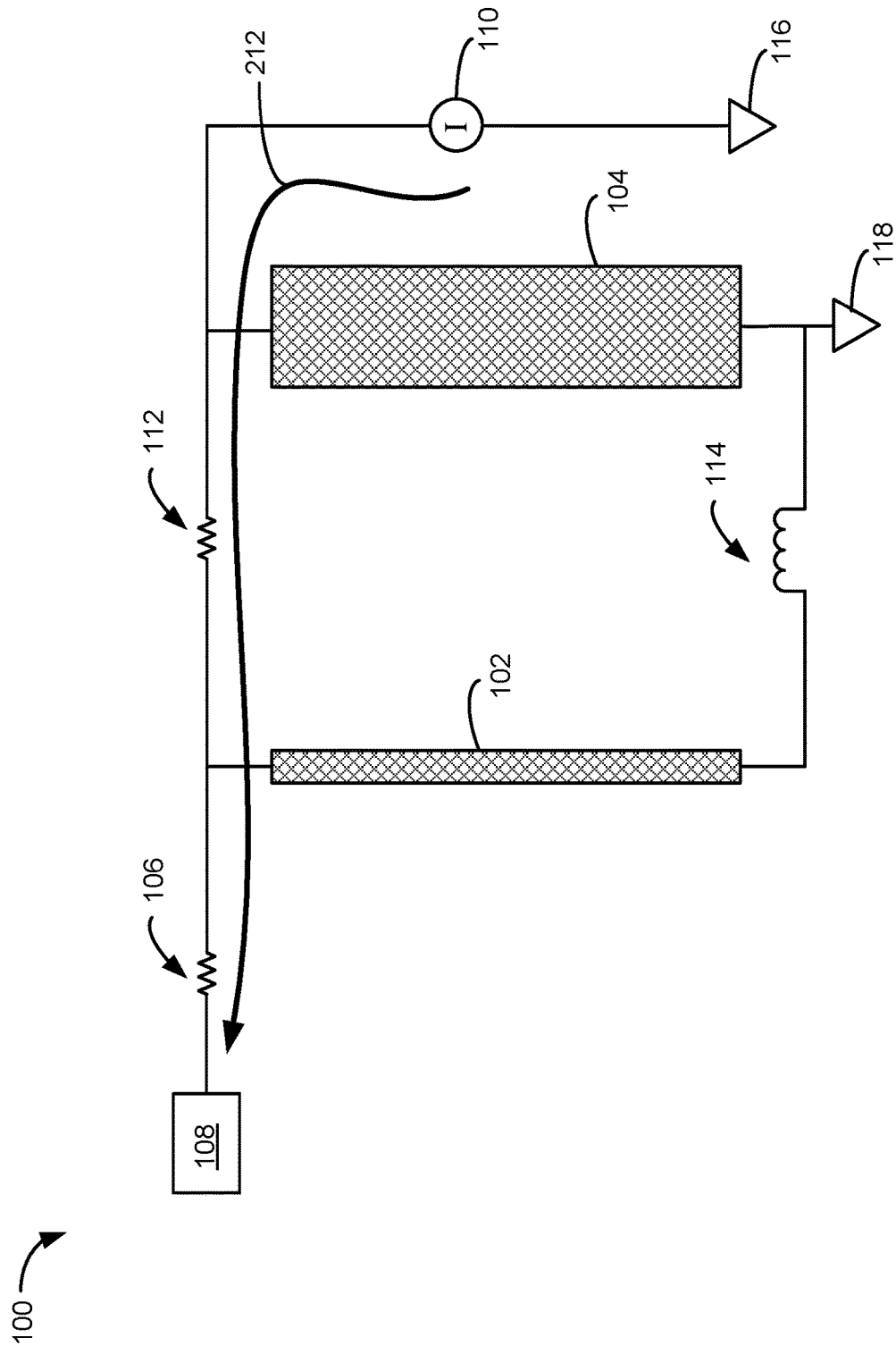

FIG. 2E shows the superconducting photodetector circuit 100 at a fifth time. As shown in FIG. 2E, at the fifth time the second superconducting wire 102 transitions to the non-superconducting state (denoted by the crosshatching of the wire 102 in FIG. 2E) in response to the current 208 supplied by the current source 110 and the photon(s) 210. The second superconducting wire 102 has a non-zero resistance while in the non-superconducting state, therefore current 212 supplied by the current source 110 is redirected through the resistor 106 to the second circuit 108. In some embodiments and instances, all of the current from the current source 110, or substantially all of the current (e.g., 95%, 98%, or 99%), flows through the resistor 106. This flow of current is due to the resistor 106 having a lower resistance than the second wire 102, and the resistors 106 and 112 having a lower resistance than the first wire 104. In some embodiments, the current 212 is readout by the second circuit 108. In some embodiments, the current 212 being supplied to the second circuit 108 provides an indication that photon(s) 210 were detected by the superconducting photodetector circuit 100.

Figure 2F:
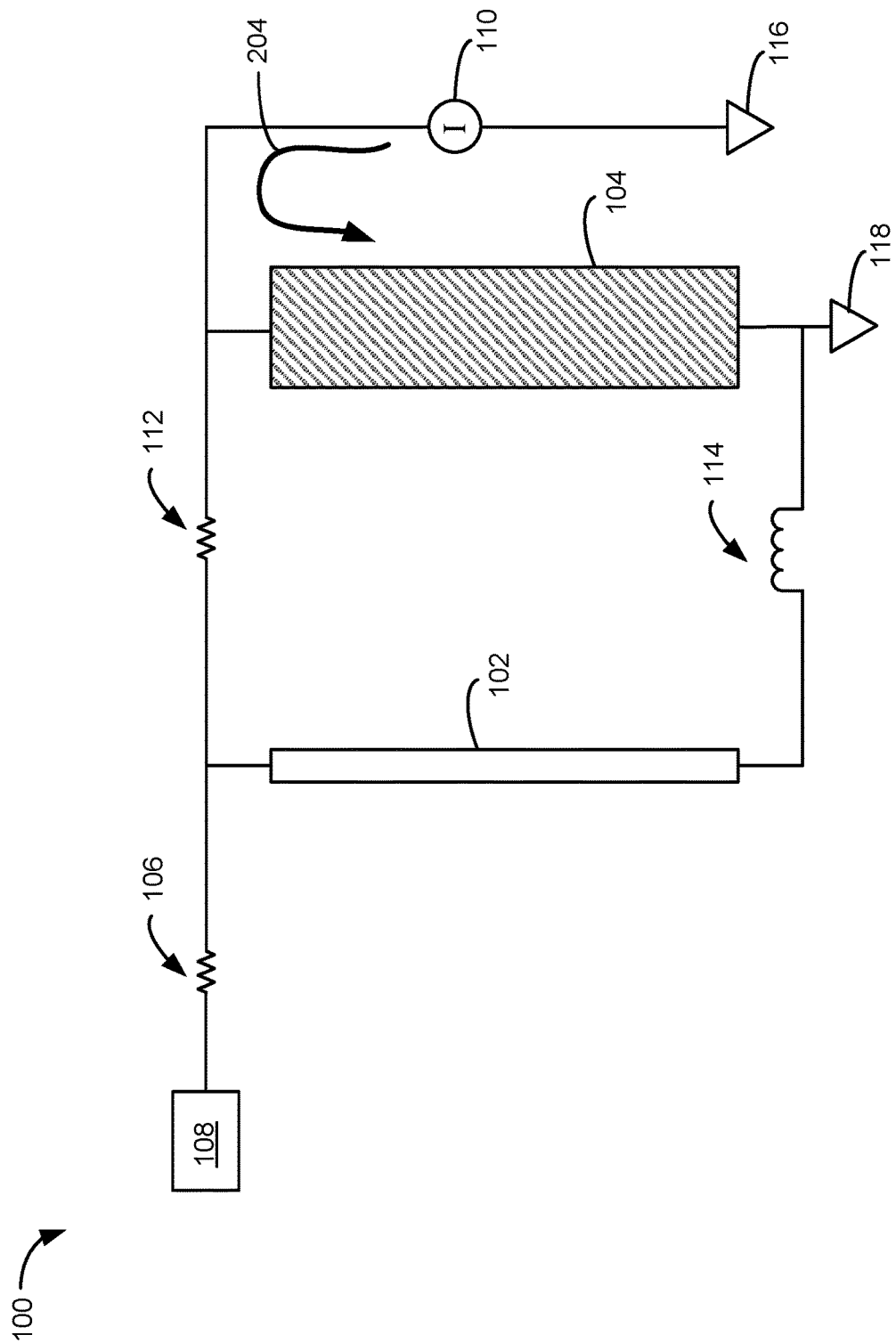

FIG. 2F shows the superconducting photodetector circuit 100 at a sixth time. As shown in FIG. 2F, at the sixth time the first wire 104 has transitioned back to the superconducting state and the second wire 102 has transitioned back to the off state. FIG. 2F also shows the current source 110 supplying the current 204 to the first superconducting wire 104. In some embodiments, the transition of the first wire 104 back to the superconducting state is based on (e.g., a rate at which the transition occurs is controlled by) the inductance of the inductor 114. In some embodiments, the inductor 114 is configured such that the transition of the first wire 104 occurs between 200 ps and 3 ns after the transition of the first wire 104 from the superconducting state to the non-superconducting state (e.g., shown in FIG. 2C).

Figure 3A:
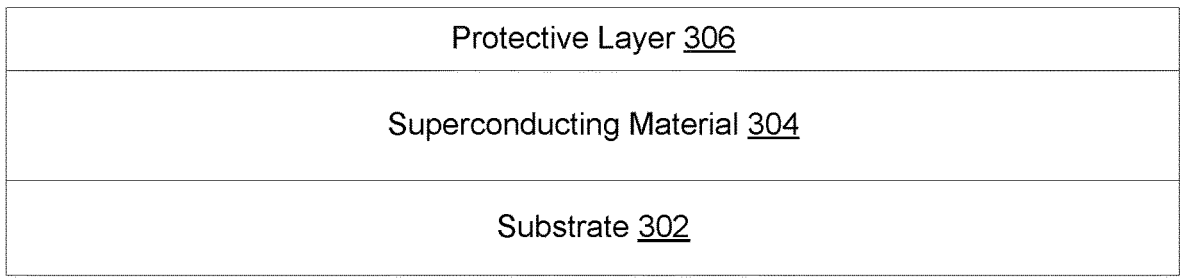
FIGS. 3A-3C are cross-sectional diagrams illustrating a representative fabrication sequence for a superconducting wire in accordance with some embodiments.
Figure 3B:
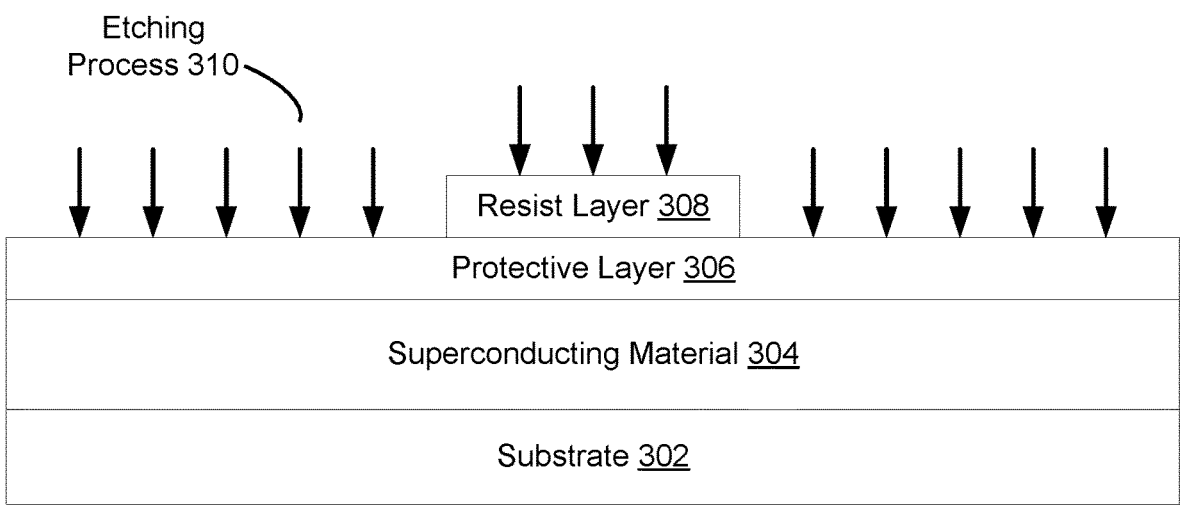
Figure 3C:
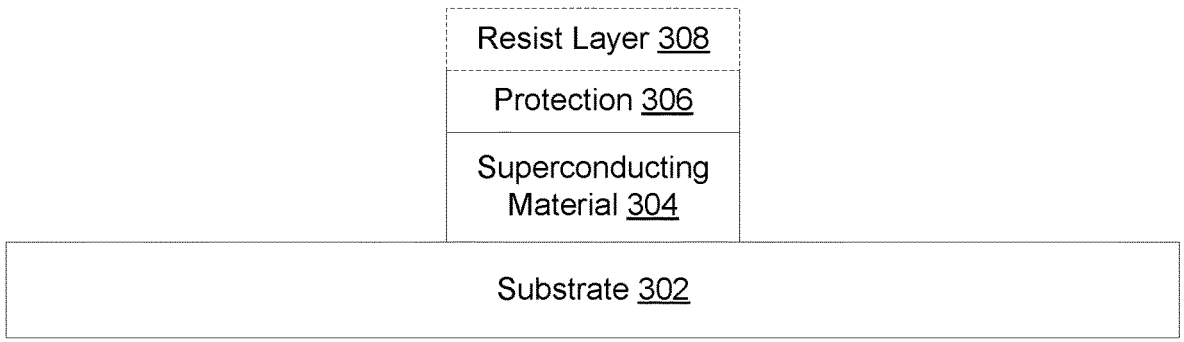

FIGS. 3A-3C are cross-sectional diagrams illustrating a representative fabrication sequence for a superconducting wire (e.g., superconducting wires 102 and 104) in accordance with some embodiments. FIG. 3A shows a superconducting material 304 disposed on a substrate 302, and a protective layer 306 disposed on the superconducting material 304, for example resulting from application of superconducting material 304 on substrate 302 and application of protective layer 306 on superconducting material 304. In some embodiments, the substrate is a silicon-based substrate, such as a silicon nitride (SiN) substrate. In some embodiments, the substrate does not include an oxide layer, so as to reduce or prevent oxidation of the superconducting material 304. In some embodiments, the superconducting material 304 is a niobium-based superconducting material, such as niobium-germanium. In some embodiments, the superconducting material 304 is a thin-film of niobium-germanium (e.g., a film having a thickness less than 100 nm, 50 nm, or 20 nm). In some embodiments, the protective layer 306 includes a passivation layer, such as a passivation layer composed of aluminum nitride (AlN). In some embodiments, the protective layer 306 consists essentially of a dielectric material. In some embodiments, the protective layer 306 is an oxide layer. In some embodiments, the protective layer 306 does not include an oxide layer, so as to reduce, inhibit, or prevent oxidation of the superconducting material 304. In some embodiments, the protective layer 306 is a thin film (e.g., a thin film having a thickness of less than 20 nm, 10 nm, 2 nm, or 1 nm).

FIG. 3B shows the addition of a resist layer 308 on the surface of the protective layer 306. In some embodiments, the resist layer 308 is composed of a polymer. In some embodiments, the resist layer 308 is a photo-resist layer and/or an electro-resist layer. In some embodiments, the resist layer 308 is deposited and then patterned, with FIG. 3B showing the result after the patterning process is complete. For example, as shown in FIG. 3B, the resist layer 308 covers only a portion of the protective layer 306. In some embodiments, the resist layer 308 is applied to only select portion(s) of the protective layer 306 (e.g., via the use of masks and the like). In some embodiments, the resist layer 308 is applied to the protective layer 306 and then portions of the resist layer 308 are removed (e.g., by the application of photons and/or electrons to cause cross-linking in portions of the resist layer followed by subsequent removal of photo resists that have not been cross-linked).

As also shown in FIG. 3B, the layers 308, 306, and 304 are exposed to an etching process 310 (e.g., dry etching or wet etching) in accordance with some embodiments. The resist layer 308 is adapted to resist the etching process 310, while the protective layer 306 and the superconducting material 304 are not adapted to resist the etching process, in accordance with some embodiments. In some embodiments, the substrate 302 is adapted to resist the etching process 310. Stated another way, in some embodiments the etching process 310 is designed to selectively etch and thus remove the materials used to form the protective layer 306 and the superconducting material 304, but not the resist layer 308 and substrate 302.

FIG. 3C shows the layers 308, 306, and 304 after application of the etching process 310. As shown in FIG. 3C, application of the etching process 310 removes portions of the protection layer 306 and the superconducting material 304 that are not covered by the resist layer 308. In some embodiments, the resist layer 308 is subsequently removed (e.g., via the application of a stripper, such as acetone, 1-methyl-2-pyrrolidon, etc.). In some embodiments, the superconducting material 304 shown in FIG. 3C is a superconducting wire (e.g., a superconducting nanowire).

Figure 4:
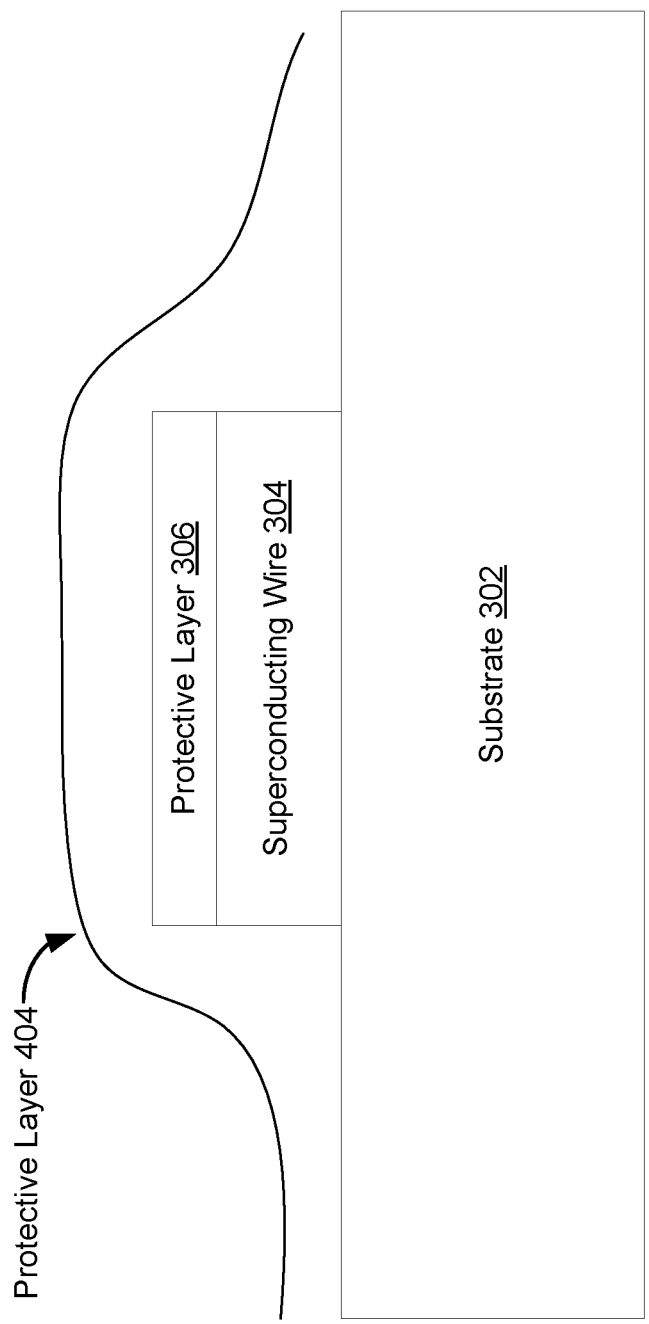
FIG. 4 is a cross-sectional diagram illustrating a representative layering for a superconducting wire in accordance with some embodiments.

FIG. 4 is a cross-sectional diagram illustrating a representative layering for a superconducting wire in accordance with some embodiments. FIG. 4 shows the superconducting wire 304 on the substrate 302 with the protective layer 306 on top of the superconducting wire 304. FIG. 4 also shows application of a second protective layer 404 over the superconducting wire 304 (e.g., to the sides of the superconducting wire 304 and on top of the protective layer 306). In some embodiments, the second protective layer 404 is a dielectric layer. In some embodiments, the second protective layer 404 consists essentially of a dielectric material. In some embodiments, the second protective layer 404 is an oxide layer. In some embodiments, the second protective layer 404 does not include an oxide layer, so as to inhibit oxidation of the superconducting material 304. In some embodiments, the second protective layer 404 is composed of aluminum nitride. In some embodiments, the second protective layer 404 is composed of a same material as the protective layer 306 (e.g., aluminum nitride). In some embodiments, the second protective layer 404 is a carbon-based dielectric material.

In some embodiments, the second protective layer 404 is applied on top of a resist layer (e.g., resist layer 308) that covers the protective layer 306. In some embodiments, the protective layer 306 is removed prior to application of the protective layer 404, such that the protective layer 404 is applied to a top surface of the superconducting wire 304. In some embodiments, the second protective layer 404 is applied via a sputtering process (e.g., at temperatures greater than 300 degrees Celsius, such as 400 degrees to 800 degrees Celsius). In some embodiments, the second protective layer 404 is a thin film (e.g., a thin having a thickness of less than 20 nm, 10 nm, or 5 nm).

Figure 5:
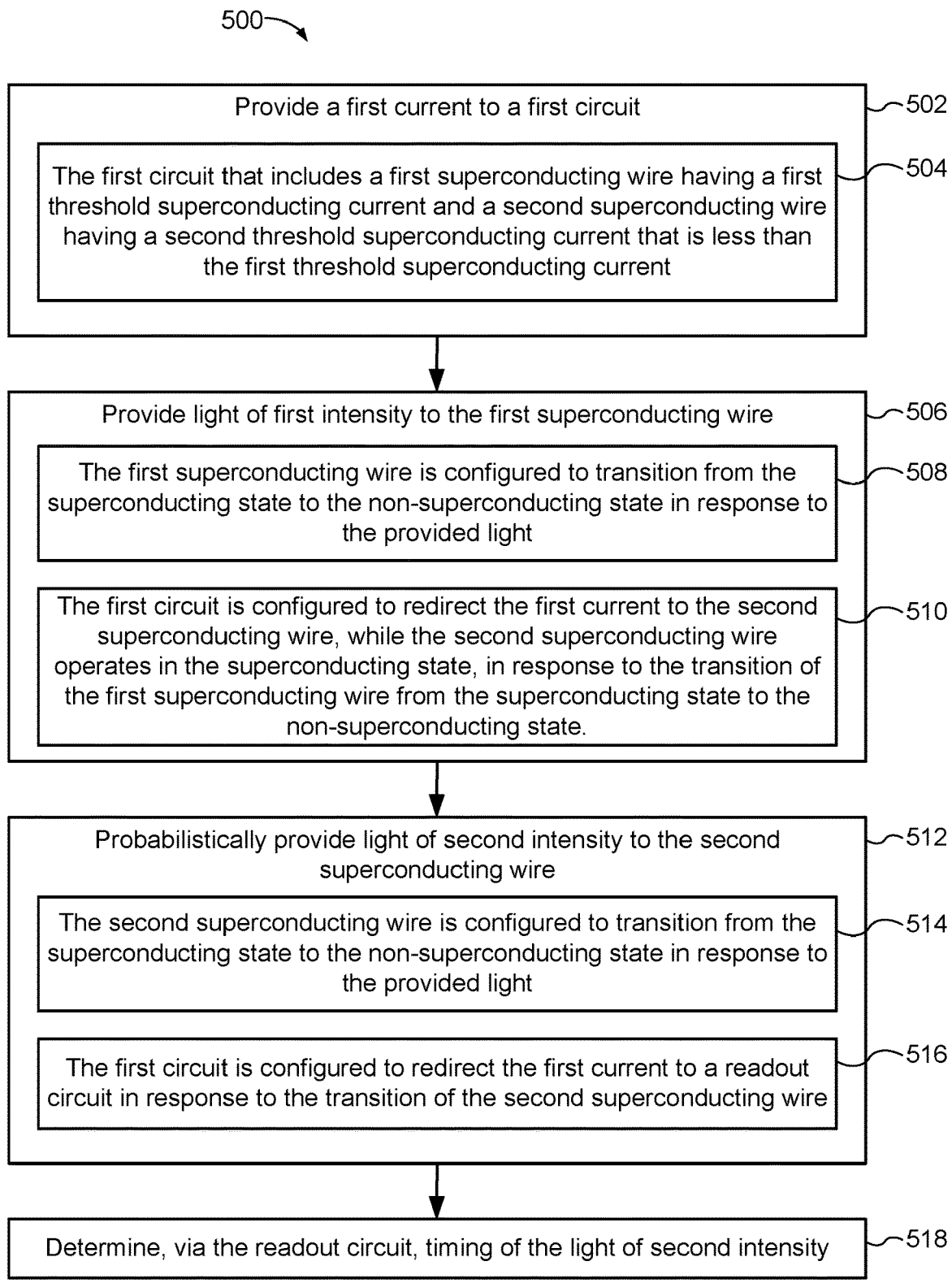
FIG. 5 is a flow diagram illustrating a representative method of detecting light in accordance with some embodiments.

FIG. 5 is a flow diagram illustrating a method 500 of detecting light in accordance with some embodiments. In some embodiments, the method 500 is performed by a photon detector system that includes a superconducting circuit (e.g., the circuit 100) and a plurality of photon sources (e.g., the photon source 202).

The photon detector system provides (502) a first current (e.g., the current 204, FIG. 2A) to a first circuit. In some embodiments, the first circuit includes (504) a first superconducting wire (e.g., the wire 104, FIG. 2A) having a first threshold superconducting current and a second superconducting wire (e.g., the wire 102, FIG. 2A) having a second threshold superconducting current that is less than the first threshold superconducting current. In other embodiments, the first and second threshold currents can be equal and in yet other embodiments, the first threshold current can be less than the second threshold current. In some embodiments, the first circuit further includes a resistor (e.g., the resistor 112, FIG. 2A) with a first end of the resistor coupled to a first end of the first superconducting wire and a second end of the resistor, opposite to the first end of the resistor, coupled to a first end of the second superconducting wire. In some embodiments, the first current is less than the second threshold superconducting current, and therefore the first superconducting wire is able to operate in a superconducting state while the first current flows through the first circuit. In some embodiments, the first current can be less than the first threshold superconducting current.

The photon detector system provides (506) light of a first intensity and/or a first energy to the first superconducting wire (e.g., via the photon source 202 as shown in FIG. 2B). The first superconducting wire is configured to (508) transition from the superconducting state to the non-superconducting state in response to the provided light. The first circuit is configured to (510) redirect the first current to the second superconducting wire, while the second superconducting wire operates (e.g., continues to operate) in the superconducting state, in response to the transition of the first superconducting wire from superconducting state to the non-superconducting state. In some embodiments, the light of first intensity causes the first superconducting wire to transition from the superconducting state to a non-superconducting state and causes redirection of the first current toward the second superconducting wire while the second superconducting wire operates (e.g., continues to operate) in a superconducting state. As already noted above, the first current is less than the second threshold superconducting current, and therefore redirection of the first current toward the second superconducting wire does not cause the second superconducting wire to transition to the non-superconducting state.

The photon detector system receives (512) light of second intensity and/or a second energy at the second superconducting wire (e.g., as shown in FIG. 2D). In some embodiments, this light is generated probabilistically via a single photon source, a photon pair source or any other light source. In some embodiments, the photons that make up the light of the second intensity can be conditionally provided as a result of an upstream quantum computing operation. The second superconducting wire is configured to (514) transition from the superconducting state to the non-superconducting state in response to the provided light. The first circuit is configured to (516) redirect the first current to a readout circuit (e.g., circuit 108) in response to the transition of the second superconducting wire to the non-superconducting state. In some embodiments, the light of second intensity causes the second superconducting wire to transition from the superconducting state to a non-superconducting state and furthermore causes redirection of the first current toward a second circuit that is coupled to the first end of the second superconducting wire. It is noted that the first current is redirected to the second circuit because both the first superconducting wire and the second superconducting wire are in a non-superconducting state.

The photon detector system determines (518), via the readout circuit, timing of the light of second intensity, i.e., the readout circuit can not only perform a binary detector measurement of the photon (photon detected or photon not detected) but the readout circuit can also associate the photon generation event with a system clock cycle or time. For example, the photon detector system determines whether receiving the light of second intensity at a given time resulted in light being received at the second superconducting wire. In some embodiments, current flowing through the second circuit (e.g., the current 212 in FIG. 2E) is measured to determine whether the light of second intensity has been received at the second superconducting wire.

In accordance with some embodiments, a method includes operating a single photon detection circuit in a non-detecting state, including: operating a first superconducting wire (e.g., wire 102, FIG. 1A) in an off state; and operating a second superconducting wire (e.g., wire 104, FIG. 1A) in a superconducting state by directing a current through the second superconducting wire. The method also includes, while operating the circuit in the non-detecting state, transitioning to operating in a detecting state, including redirecting the current through the first superconducting wire. Operating in the detecting state includes: operating the first superconducting wire in a superconducting state; operating the second superconducting wire in a non-superconducting state; while operating the circuit in the detecting state, receiving the single photon at the first superconducting wire; and in response to receiving the single photon, redirecting the current to a circuit coupled to the first superconducting wire.

In some embodiments, transitioning to operating in the detecting state includes supplying an amount of current to the second superconducting wire that exceeds a threshold superconducting current for the second superconducting wire. In some embodiments, at least a portion of the current supplied to the second superconducting wire is received via a plurality of photons contacting the second superconducting wire.

Figure 6:
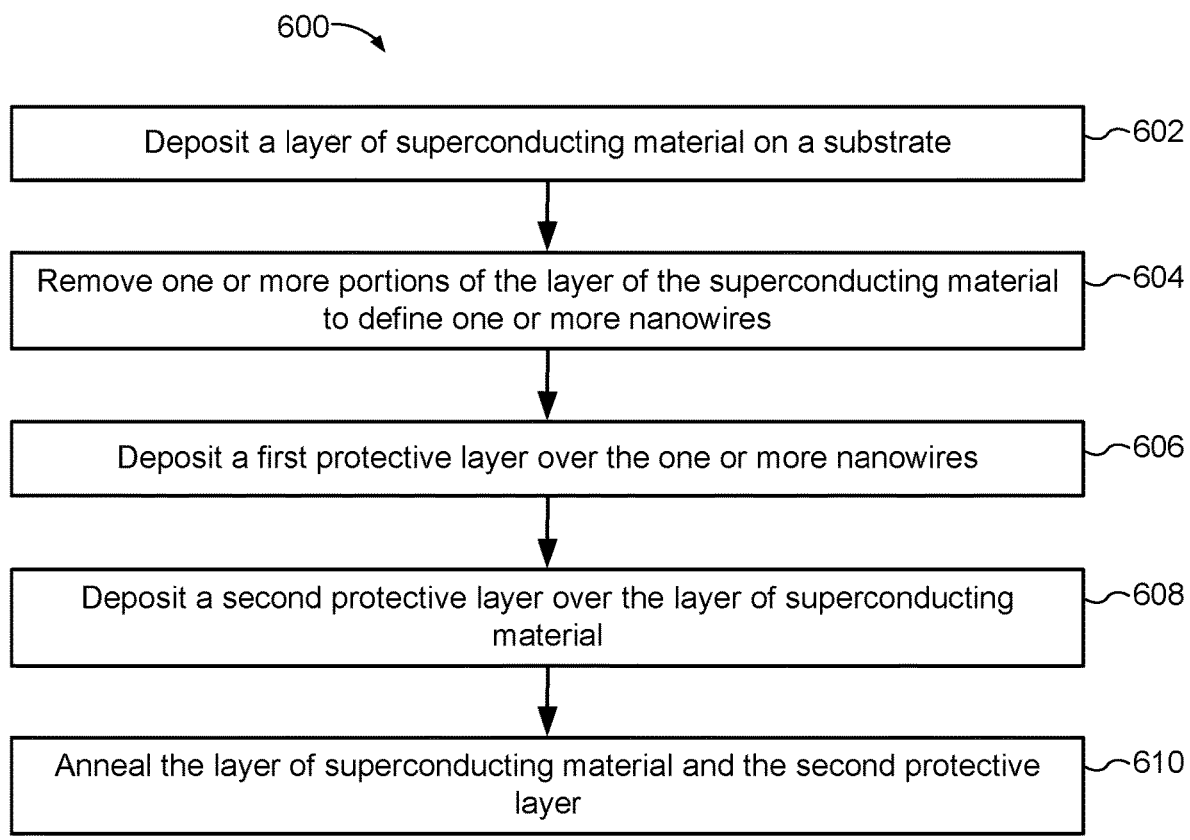
FIG. 6 is a flow diagram illustrating a representative method of fabricating a superconducting circuit in accordance with some embodiments.

FIG. 6 is a flow diagram illustrating a method 600 of fabricating a superconducting circuit in accordance with some embodiments. In accordance with some embodiments, the method 600 includes: (1) depositing (602) a thin film of a superconducting material (e.g., niobium-germanium) over a substrate; and (2) removing (604) one or more portions of the thin film to define: (a) a first superconducting wire having a first threshold superconducting current; and (b) a second superconducting wire having a second threshold superconducting current that is less than the first threshold superconducting current. In some embodiments, the method 600 further includes depositing a protective layer over the nanowires (e.g., protective layer 404 in FIG. 4). In some embodiments, the method 600 further includes depositing (608) a second protective layer over the layer of superconducting material (e.g., protective layer 306). In some embodiments, the method further includes annealing (610) the layer of superconducting material and the second protective layer.

In some embodiments, the method further includes coupling a first end of a resistor to a first end of the first superconducting wire and coupling a second end of the resistor, opposite to the first end of the resistor, to a first end of the second superconducting wire.

In some embodiments, the method further includes coupling a second end of the first superconducting wire that is opposite to the first end of the first superconducting wire, to a second end of the second superconducting wire that is opposite to the first end of the second superconducting wire.

In accordance with some embodiments, a method for fabricating a superconducting wire includes: (1) depositing a layer of niobium-germanium (e.g., superconducting wire 104); (2) removing one or more portions of the layer of niobium-germanium to define one or more nanowires (e.g., as shown in FIGS. 3B-3C); and (3) depositing a protective layer over the one or more nanowires (e.g., protective layer 404 in FIG. 4). In some instances, the protective layer reduces or prevents oxidation of niobium-germanium in the one or more nanowires. In some embodiments, the protective layer is deposited after the one or more portions of the layer of niobium-germanium are removed to define the one or more nanowires. In some embodiments, the nanowires are defined by a patterned resist layer deposited on top of the layer of niobium-germanium. In some embodiments, a reactive ion etch process (e.g., a $CF_4$ reactive ion etch process) transfers the pattern of the resist layer to the niobium-germanium layer.

In some embodiments, the layer of niobium-germanium is deposited by physical vapor deposition. In some embodiments, the layer of niobium-germanium is deposited at a temperature between 400 and 800° Celsius. In some embodiments, the layer of niobium-germanium is deposited by sputtering.

In some embodiments, the method further includes depositing a second protective layer over the layer of niobium-germanium (e.g., protective layer 306). In some embodiments, the second protective layer is deposited before the one or more portions of the layer of niobium-germanium are removed to define the one or more nanowires. In some embodiments, removing the one or more portions of the layer of niobium-germanium to define the one or more nanowires includes removing one or more corresponding portions of the second protective layer.

In some embodiments, the method further includes annealing the layer of niobium-germanium and the second protective layer. In some embodiments, the layer of niobium-germanium and the second protective layer are annealed at a temperature between 800° and 1500° Celsius. In some embodiments, the layer of niobium-germanium and the second protective layer are annealed in a nitrogen gas or vacuum environment. In some embodiments, the layer of niobium-germanium is annealed independently of the second protective layer (e.g., without annealing second protective layer).

FIGS. 7A-7B illustrate a photonic circuit that employs a gated superconducting photon detector in accordance with one or more embodiments. The system includes a gating path waveguide 721 that is optically coupled to a gate input port 722 of a gated superconducting photon detector 707. The system further includes a detection path waveguide 715 that is optically coupled to a detection input port 725 of gated superconducting photon detector 707. For the sake of clarity, photons are depicted as open circles that are adjacent to a waveguide but one of ordinary skill will recognize that in the physical device, photons will propagate within a guided mode of the waveguide itself. The gated superconducting photon detector 707 can be of any type described above in reference to FIGS. 1A-2F. In operation, one or more gate photons 702 are generated by a gating photon source (not shown) and coupled into the gating path waveguide 721. In some embodiments, the gating photon source can be a pump photon source that is optically coupled to a photon pair generator for generating pairs of photons by a nonlinear process such as spontaneous four wave mixing and the like, as illustrated further in FIG. 7B below. However, any light source (that generates any number of photons, i.e., pulses of light) can be used for the gating photon source without departing from the scope of the present disclosure.

In some embodiments, the one or more gating photons 702 correspond to photons 206 described above in reference to FIG. 2B. Once absorbed, the action of the gating photons is to cause a transition from a superconducting state to a non-superconducting state in a superconducting gating wire (e.g., wire 104 shown in FIG. 2A-2F), thereby redirecting a bias current from current source 110 through another superconducting wire (e.g., wire 102, also referred to herein as the photon detection wire), as shown and described above in reference to, e.g., FIGS. 2A-2F. Once biased with the appropriate current, the superconducting photon detector 707 is ready to detect any photons 704 that are propagating within the detection path waveguide 715. Such photons can be generated from any source, e.g., from the same photon pair generator that was pumped by the gating photon source, as shown in FIG. 7B below, or from any external source of light without departing from the scope of the present disclosure.

As described above, a detection of the photon 704 is accompanied by a transition of the wire 102 to a normal state thereby redirecting the current from current source 110 to the circuitry 108, which can be any downstream circuitry, e.g., an amplifier, switch, digital logic circuit.

The ability to optically trigger, i.e., gate the current biasing of the photon detection wire provides for a system with reduced dark counts. This is because before the gating photon is absorbed, there is no current flowing through the superconducting wire 102 and thus, absorption of a stray photon will not lead to any redirection of current to the circuitry 108.

FIG. 7B illustrates a heralded single photon source that employs a gated superconducting photon detector in accordance with one or more embodiments. Such a source can be used within any system for which a source of single photons is useful, e.g., within a quantum communications system and/or a quantum computer that employs entangled photons as the physical qubits.

A heralded single photon source 700 is illustrated in accordance with one or more embodiments. Thick black lines in the figure represent optical waveguides and thin black lines represent electrical interconnects (e.g. wires that may be formed from superconducting or non-superconducting materials). The system is a hybrid photonic/electrical circuit that includes a pumped photon pair generator 703, a wavelength division multiplexer (WDM) 705 (which is a 1×2 WDM in this example), a gated superconducting photon detector 707, an amplifier circuit 709, and an optical switch 711. One or more components of the system can be housed in a cryogenic environment, such as a cryostat, held at a temperature that is lower than the threshold temperature for superconductivity, as described above.

An input optical waveguide 713 optically couples a pump photon source (not shown) to photon pair generator 703. A pump photon 702 enters the pumped photon pair generator 703 via input optical waveguide 713. In some embodiments, the pumped photon pair generator 703 can include a non-linear optical material that generates two output photons, referred to as idler photon 704 and signal photon 706 from one or more input pump photons 702. For example, the pumped photon pair generator 703 can generate a pair of output photons using a process known as spontaneous four wave mixing. The pair of output photons, signal photon 704 and idler photon 706, are typically generated having different wavelengths/frequencies, e.g., with the sum of the energies of the signal and idler equal to the energy of the pump photon. After generation, signal photon 704 and idler photon 706 are optically coupled to the input of WDM 705 via waveguide 708. In addition, a surplus pump photon (not shown) can be coupled to the gating input 722 of the gated superconducting photon detector 707, via the gating path waveguide 721, (e.g., using a WDM or dichroic beam splitter that is internal to the pumped photon pair source 703). This gating photon is subsequently absorbed, initializing the gated superconducting photon detector 707 as described above. In other embodiments, the gating photon can be generated separately from the pump light, in any suitable way that is time correlated with the generation of the pump photons.

Because the signal and idler photons have different wavelengths/frequencies, WDM 705 redirects the idler and signal photons along different output waveguides, e.g., signal photon 704 is directed along the heralding waveguide path 720 and idler photon 706 is redirected along the switched output waveguide path 715. Which photon is directed to which path is not critical and the path of the idler photon and signal photon can be exchanged without departing from the scope of the present disclosure. In some examples, the gating can even be accomplished via electrical means, e.g., by way of one or more current pulses. One of ordinary skill will appreciate that many gating techniques and signals can be employed without departing from the scope of the present disclosure.

In this example, a gated superconducting photon detector 707, e.g., a gated superconducting nanowire single photon detector, is optically coupled to the heralding waveguide path 720 and can produce an electrical signal (e.g. a current pulse, also referred to as a photon heralding signal) in response to the gated detection of the signal photon 704. Because the signal photon 704 and idler photon 706 were generated nearly simultaneously as a pair, the electrical signal generated by the photon detector 707 signals (i.e., "heralds") the presence of the idler photon 706 in the switched waveguide path 715. The heralding signal is often a small amplitude current signal, e.g., microamps or less, and can be provided to an amplifier circuit 709, e.g., a superconducting nanowire current amplifier where it is amplified to a larger output signal that can be used to more effectively drive any downstream electronic and/or photonic circuits. The amplified signal is then provided to the optical switch 711 via output electrical signal line 714. After being switched, the idler photon 715 is provided via output waveguide 719, e.g., for use in constructing a highly entangled resource state for use in a downstream optical quantum computing system (not shown).

Figure 7C:
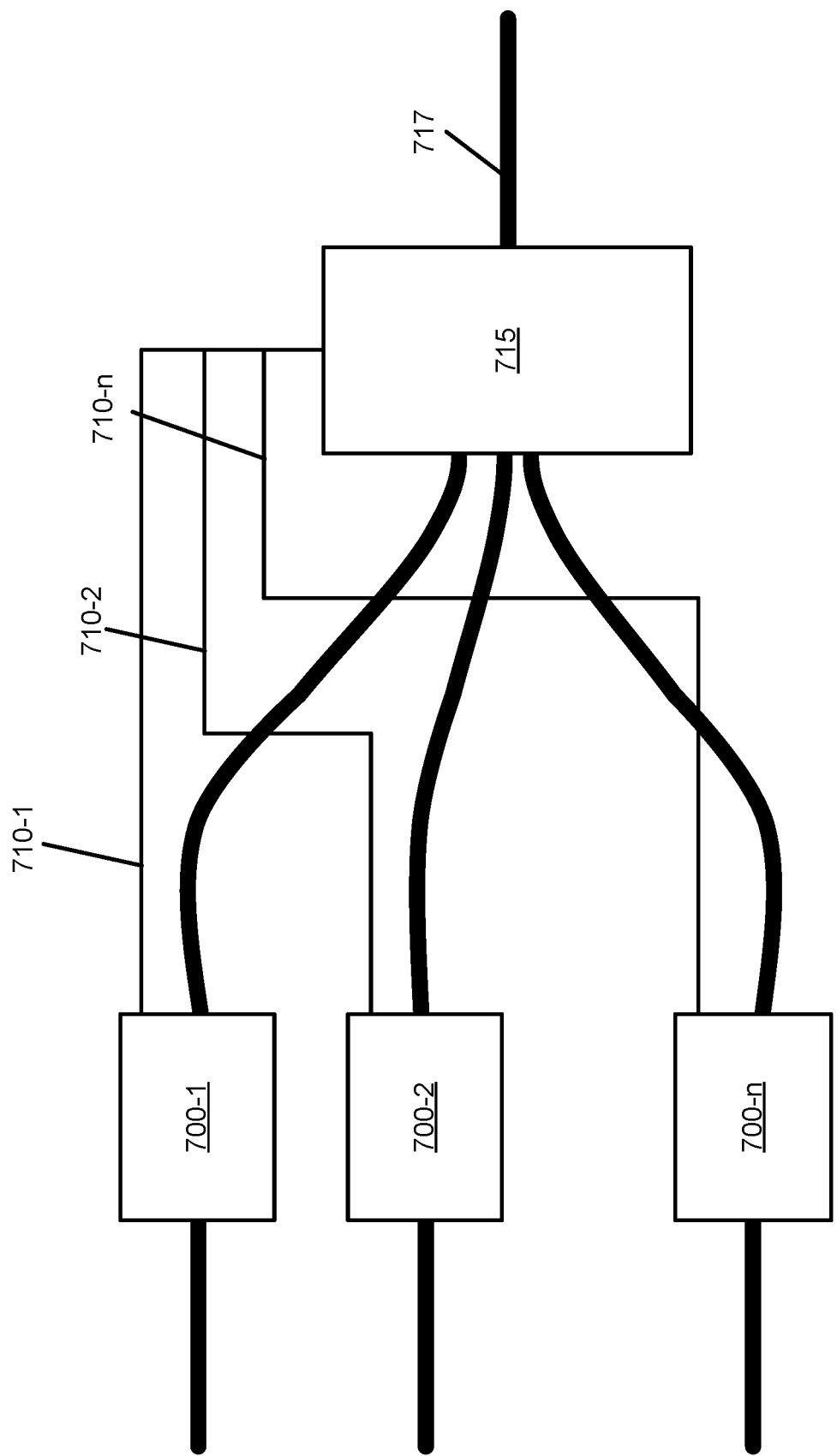

FIG. 7C illustrates how several single photon sources similar to photon source 700 can be multiplexed to increase the reliability of the photon generation process. Such a system is beneficial because of the non-deterministic nature of the conversion between the pump photon and the photon pair in the photon pair generator 703. More specifically, because the photon pair generation process is a quantum mechanical process, it is inherently probabilistic, and thus it is not guaranteed that every pump photon that enters a photon pair generator 703 will result in the generation of a photon pair at the output. In fact, in some instances, the photon pair creation can fail entirely. Thus, to improve the reliability of the photon generation process, several single photon generators 700-1, 700-2, . . . , 700-n, each receiving its own pump photon per generation cycle, can be arranged in parallel and optically (and electrically) coupled to a N×1 switch 715, as shown. As with the heralded single photon source 700, each single photon generator 700-1, 700-2, . . . , 700-n possesses a dedicated heralding electrical signal line 710-1, 710-2, . . . , 710-n which can provide a heralding signal that informs a downstream circuit element of the successful generation of a photon by that particular photon source. In some embodiments, the heralding electrical signal lines 710-1, 710-2, . . . , 710-n are electrically coupled to the N×1 switch 715. N×1 switch 715 includes digital logic that interprets the heralding electrical signals and switches the input port of the N×1 switch accordingly so as to provide a generated idler photon to the output port 717 of the N×1 switch 715. Thus, in this case, each photon source 700 includes a superconducting amplifier circuit whose internal arrangement of current sources and parallel superconducting wires provides for enough amplification to drive the logic stage of the N×1 switch. In other examples, a small signal logic circuit can be employed before the amplifier and N×1 switch. One of ordinary skill will appreciate that other arrangements are possible without departing from the scope of the present disclosure.

In light of these principles, we now turn to certain embodiments.

In accordance with some embodiments, a photon detector system includes: (1) a first circuit (e.g., the circuit 100, FIG. 1A) with: (a) a first superconducting wire (e.g., the wire 104, FIG. 1A) having a first threshold superconducting current; (b) a second superconducting wire (e.g., the wire 102, FIG. 1A) having a second threshold superconducting current that is less than the first threshold superconducting current; and (c) a resistor (e.g., the resistor 112, FIG. 1A) with a first end of the resistor coupled to a first end of the first superconducting wire and a second end of the resistor, opposite to the first end of the resistor, coupled to a first end of the second superconducting wire; (2) one or more current sources (e.g., the current source 110, FIG. 1A) coupled to the first end of the first superconducting wire, the one or more current sources configured to supply a first current (e.g., bias current) that is below the second threshold superconducting current; and (3) a second circuit (e.g., the second circuit 108, FIG. 1A) coupled to the first end of the second superconducting wire. In response to receiving light of first intensity (e.g., photons 206, FIG. 2B) at the first superconducting wire, the first superconducting wire transitions from a superconducting state (e.g., shown in FIG. 2B) to a non-superconducting state (e.g., shown in FIG. 2C), thereby redirecting at least a first portion of the first current through the resistor. In response to receiving light of second intensity (e.g., photon(s) 210, FIG. 2D) that is less than the first intensity at the second superconducting wire while the first superconducting wire is in the non-superconducting state, the second superconducting wire transitions from a superconducting state (e.g., shown in FIG. 2D) to a non-superconducting state (e.g., shown in FIG. 2E), thereby redirecting at least a second portion of the first current to the second circuit. In some embodiments, the first current is at least 70% of the second threshold superconducting current. Depending on the energy (i.e., frequency) of the photons involved, in other embodiments the second intensity can be equal to or greater than the first intensity.

In some embodiments, in response to receiving the light of second intensity at the second superconducting wire, the portion of the first current that is redirected to the second circuit remains increased for a period of time between 200 ps and 3 ns. In some embodiments, the first superconducting wire and the second superconducting wire operate in a superconducting state while the first current is provided (in the absence of additional current or photons provided to the first superconducting wire or the second superconducting wire).

In some embodiments, the first circuit includes an inductor (e.g., the inductor 114, FIG. 1A) with a first end of the inductor coupled to a second end of the first superconducting wire and a second end of the inductor, opposite to the first end of the inductor, coupled to a second end of the second superconducting wire. In some embodiments, the inductor is configured to delay a transition of the first superconducting wire from the non-superconducting state to the superconducting state.

In some embodiments, the resistor has a resistance (e.g., 50 ohms) that less than a resistance of the first superconducting wire operating in the non-superconducting state. In some embodiments, the resistor has a resistance that is equal to the resistance of the first superconducting wire operating in the non-superconducting state (e.g., 2000 ohms). In some embodiments, the resistor has a resistance that is greater than the resistance of the first superconducting wire operating in the non-superconducting state (e.g., 4000 ohms).

In some embodiments, the second circuit has a resistance (e.g., represented by resistor 106, FIG. 1A) less than a resistance of the second superconducting wire operating in the non-superconducting state (e.g., 50 ohms). In some embodiments, the second circuit has a resistance that is equal to the resistance of the second superconducting wire operating in the non-superconducting state. In some embodiments, the second circuit has a resistance that is greater than the resistance of the second superconducting wire operating in the non-superconducting state.

In some embodiments, the first superconducting wire and the second superconducting wire have a same length. In some embodiments, the length is between 200 nm and 20 microns. In some embodiments, the first superconducting wire has a first width and the second superconducting wire has a second width that is less than the first width. In some embodiments, the second wire has a width between 20 nm and 150 nm. In some embodiments, the first wire has a width between 250 nm and 400 nm. In some embodiments, the first superconducting wire and the second superconducting wire have a same thickness. In some embodiments, the thickness is between 2 nm and 10 microns. In some embodiments, the first superconducting wire and the second superconducting wire are each composed of a same superconducting material. In some embodiments, the superconducting material is niobium or a niobium alloy.

In some embodiments, the light of first intensity corresponds to a pulse including at least 100 photons. In some embodiments, the number of photons is between 100 and 5000 photons. In some embodiments, the pulse has duration less than 5 ns. In some embodiments, the photons have a wavelength in the range of 400 nm to 2100 nm. In some embodiments, the light of second intensity corresponds to a pulse including only a single photon.

In some embodiments, the photon detector system further includes: (1) a first photon source (e.g., photon source 202, FIG. 2B) configured to provide the light of a first intensity to the first superconducting wire; and (2) a second photon source (e.g., a single-photon source) configured to provide the light of a second intensity to the second superconducting wire. In some embodiments, the first photon source is coupled with the second photon source. For example, in some embodiments, the second photon source is configured to provide one or more photons in temporal proximity to the provision of light by the first photon source. In some embodiments, the first photon source is distinct and separate from the second photon source.

In some embodiments, a combination of the first current and photoelectrons generated by the first superconducting wire (e.g., wire 104, FIG. 2B, upon receiving one or more photons 206) upon receiving the light of first intensity (e.g., one or more photons 206, FIG. 2B) is greater than the first threshold superconducting current. In some embodiments, the first current is greater than the first threshold superconducting current after it has been reduced by the photons from the first photon source. In some embodiments, a combination of the first current and one or more photoelectrons generated by the second superconducting wire (e.g., wire 102, FIG. 2D, upon receiving photons 210) upon receiving the light of second intensity (e.g., photons 210) is greater than the second threshold superconducting current. In some embodiments, the first current is greater than the second threshold superconducting current after it has been reduced by the photons from the second photon source.

In some embodiments, the light of second intensity is received at the second superconducting wire within 3 ns after receiving the light of first intensity at the first superconducting wire (e.g., the second time represented in FIG. 2B is within 3 ns of the fourth time represented in FIG. 2D). In some embodiments, the light of second intensity is received at the second superconducting wire within 3 ns from receiving the light of first intensity at the first superconducting wire. In some embodiments, the light of second intensity is received at the second superconducting wire concurrently with receiving the light of first intensity at the first superconducting wire.

In accordance with some embodiments, an electronic device includes: (1) a first superconducting wire (e.g., the wire 104, FIG. 1A) having a first threshold superconducting current; (2) a second superconducting wire (e.g., the wire 102, FIG. 1A) having a second threshold superconducting current that is less than the first threshold superconducting current; and (3) a resistor (e.g., the resistor 112, FIG. 1A) with a first end of the resistor coupled to a first end of the first superconducting wire and a second end of the resistor, opposite to the first end of the resistor, coupled to a first end of the second superconducting wire.

In some embodiments, a second end of the first superconducting wire, opposite to the first end of the first superconducting wire, is electrically coupled to a second end of the second superconducting wire, opposite to the first end of the second superconducting wire. In some embodiments, a second end of the first superconducting wire, opposite to the first end of the first superconducting wire, is indirectly coupled to a second end of the second superconducting wire, opposite to the first end of the second superconducting wire (e.g., one or more electrical components, such as an inductor, are connected between the second end of the first superconducting wire and the second end of the second superconducting wire).

Although some of various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages could be implemented in hardware, firmware, software or any combination thereof.

It will also be understood that, although the terms first, second, etc. are, in some instances, used herein to describe various elements, these elements should not be limited by these terms. These terms are only used to distinguish one element from another. For example, a first current could be termed a second current, and, similarly, a second current could be termed a first current, without departing from the scope of the various described embodiments. The first current and the second current are both currents, but they are not the same condition unless explicitly stated as such.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. An electronic device, comprising:
    a first superconducting wire having a first threshold superconducting current, wherein the first superconducting wire includes a first end of the first superconducting wire and a second end of the first superconducting wire;
    a second superconducting wire having a second threshold superconducting current that is less than the first threshold superconducting current, wherein:
        the second superconducting wire includes a first end of the second superconducting wire and a second end of the second superconducting wire; and
        the second end of the first superconducting wire and the second end of the second superconducting wire are coupled to a common voltage node;
    a resistor coupled between the first superconducting wire and the second superconducting wire, with a first end of the resistor coupled to the first end of the first superconducting wire and a second end of the resistor, opposite to the first end of the resistor, coupled to the first end of the second superconducting wire; and
    a current source coupled with the first superconducting wire, and coupled with a combination of the resistor and the second superconducting wire.

2. The electronic device of claim 1, wherein the second end of the second superconducting wire is coupled to the common voltage node through an inductor.

3. The electronic device of claim 2, further comprising the inductor, wherein a first end of the inductor is coupled to the second end of the first superconducting wire and a second end of the inductor, opposite to the first end of the inductor, is coupled to the second end of the second superconducting wire.

4. The electronic device of claim 1, wherein the resistor has a resistance that is less than a resistance of the first superconducting wire while the first superconducting wire is in a non-superconducting state.

5. The electronic device of claim 1, wherein the first superconducting wire and the second superconducting wire have a same length.

6. The electronic device of claim 1, wherein the first superconducting wire has a first width and the second superconducting wire has a second width that is less than the first width.

7. The electronic device of claim 1, wherein the first superconducting wire and the second superconducting wire have a same thickness.

8. The electronic device of claim 1, wherein:
    when the first superconducting wire transitions from a superconducting state to a non-superconducting state, at least a first portion of a current supplied by the current source is redirected through the resistor; and
    in response to the electronic device receiving light while the first superconducting wire is in the non-superconducting state, the second superconducting wire transitions from a superconducting state to a non-superconducting state.

9. The electronic device of claim 8, wherein at least a second portion of the current is redirected to a readout circuit in response to the second superconducting wire transitioning from the superconducting state to the non-superconducting state.

10. An electronic device, comprising:
a first superconducting wire having a first threshold superconducting current, wherein the first superconducting wire includes a first end of the first superconducting wire and a second end of the first superconducting wire;
a second superconducting wire having a second threshold superconducting current that is less than the first threshold superconducting current, wherein:
the second superconducting wire includes a first end of the second superconducting wire and a second end of the second superconducting wire; and
the second end of the first superconducting wire and the second end of the second superconducting wire are coupled to a common voltage node;
a resistor coupled between the first superconducting wire and the second superconducting wire, with a first end of the resistor coupled to the first end of the first superconducting wire and a second end of the resistor, opposite to the first end of the resistor, coupled to the first end of the second superconducting wire;
a first photon source coupled to the first superconducting wire; and
a second photon source coupled to the second superconducting wire.

11. The electronic device of claim 10, wherein the second end of the second superconducting wire is coupled to the common voltage node through an inductor.

12. The electronic device of claim 11, further comprising an inductor, wherein a first end of the inductor is coupled to a second end of the first superconducting wire and a second end of the inductor, opposite to the first end of the inductor, is coupled to a second end of the second superconducting wire.

13. The electronic device of claim 10, wherein the resistor has a resistance that is less than a resistance of the first superconducting wire while the first superconducting wire is in a non-superconducting state.

14. The electronic device of claim 10, wherein the first superconducting wire and the second superconducting wire have a same length.

15. The electronic device of claim 10, wherein the first superconducting wire has a first width and the second superconducting wire has a second width that is less than the first width.

16. The electronic device of claim 10, wherein the first superconducting wire and the second superconducting wire have a same thickness.

17. The electronic device of claim 10, wherein:
in response to the first photon source supplying light of first intensity, the first superconducting wire transitions from a superconducting state to a non-superconducting state, thereby redirecting at least a first portion of a current through the resistor; and
in response to the second photon source supplying light of second intensity while the first superconducting wire is in the non-superconducting state, the second superconducting wire transitions from a superconducting state to a non-superconducting state, thereby redirecting at least a second portion of the current to a readout circuit.

* * * * *